United States Patent
Lin et al.

(10) Patent No.: US 10,971,222 B2
(45) Date of Patent: Apr. 6, 2021

(54) DYNAMIC BIT-SCAN TECHNIQUES FOR MEMORY DEVICE PROGRAMMING

(71) Applicant: SANDISK TECHNOLOGIES LLC, Addison, TX (US)

(72) Inventors: Lei Lin, Fremont, CA (US); Zhuojie Li, Newark, CA (US); Henry Chin, Fremont, CA (US); Cynthia Hsu, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/717,532

(22) Filed: Dec. 17, 2019

(65) Prior Publication Data

US 2020/0126613 A1    Apr. 23, 2020

Related U.S. Application Data

(62) Division of application No. 16/000,413, filed on Jun. 5, 2018, now Pat. No. 10,535,401.

(51) Int. Cl.

| | |
|---|---|
| *G11C 16/06* | (2006.01) |
| *G11C 11/56* | (2006.01) |
| *G11C 16/04* | (2006.01) |
| *G11C 16/34* | (2006.01) |
| *G11C 16/26* | (2006.01) |
| *G11C 29/12* | (2006.01) |
| *G11C 16/08* | (2006.01) |

(52) U.S. Cl.
CPC ...... *G11C 11/5628* (2013.01); *G11C 16/0483* (2013.01); *G11C 16/08* (2013.01); *G11C 16/26* (2013.01); *G11C 16/3459* (2013.01); *G11C 29/12* (2013.01); *G11C 2029/1202* (2013.01)

(58) Field of Classification Search
CPC . G11C 11/5628; G11C 16/0483; G11C 16/08; G11C 16/26; G11C 16/3459; G11C 29/12; G11C 2029/1202; G11C 16/06
USPC ................................................. 365/185.22
See application file for complete search history.

(56) References Cited

U.S. PATENT DOCUMENTS

| | | | |
|---|---|---|---|
| 8,427,884 | B2 | 4/2013 | Lin et al. |
| 9,437,302 | B2 * | 9/2016 | Tseng ................. G11C 11/5628 |
| 9,552,882 | B2 * | 1/2017 | Tseng ................. G11C 11/5628 |
| 2007/0147141 | A1 | 6/2007 | Shibata |
| 2011/0235420 | A1 | 9/2011 | Sharon et al. |
| 2013/0070530 | A1 | 3/2013 | Chen et al. |
| 2014/0237298 | A1 | 8/2014 | Pe'er |

(Continued)

OTHER PUBLICATIONS

International Search Report and Written Opinion dated May 22, 2019 in International Patent Application No. PCT/US2019/017075.

(Continued)

*Primary Examiner* — Harry W Byrne
(74) *Attorney, Agent, or Firm* — Vierra Magen Marcus LLP

(57) ABSTRACT

An apparatus is provided that includes a plurality of memory cells, a programming circuit configured to apply a plurality of programming pulses to the memory cells, and a scanning circuit configured to repeatedly switch between performing an n-state bitscan after each programming pulse until first predetermined criteria are satisfied, and performing an m-state bitscan after each programming pulse until second predetermined criteria are satisfied, where m>n, and n>0.

7 Claims, 26 Drawing Sheets

(56) References Cited

U.S. PATENT DOCUMENTS

| | | | |
|---|---|---|---|
| 2015/0221348 A1* | 8/2015 | Tseng | G11C 11/5628 711/103 |
| 2015/0221391 A1* | 8/2015 | Tseng | G11C 11/5628 365/185.19 |
| 2016/0358664 A1 | 12/2016 | Li et al. | |
| 2017/0076802 A1 | 3/2017 | Mokhlesi | |
| 2017/0125117 A1 | 5/2017 | Tseng et al. | |

OTHER PUBLICATIONS

Office Action dated Apr. 19, 2019 in U.S. Appl. No. 16/000,413.
Response to Office Action filed May 22, 2019 in U.S. Appl. No. 16/000,413.
Notice of Allowance and Fee(s) Due dated Sep. 10, 2019 in U.S. Appl. No. 16/000,413.

* cited by examiner

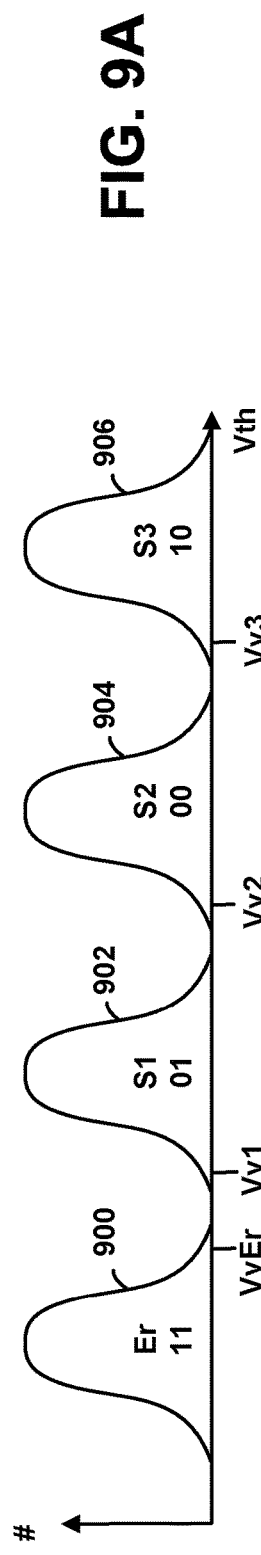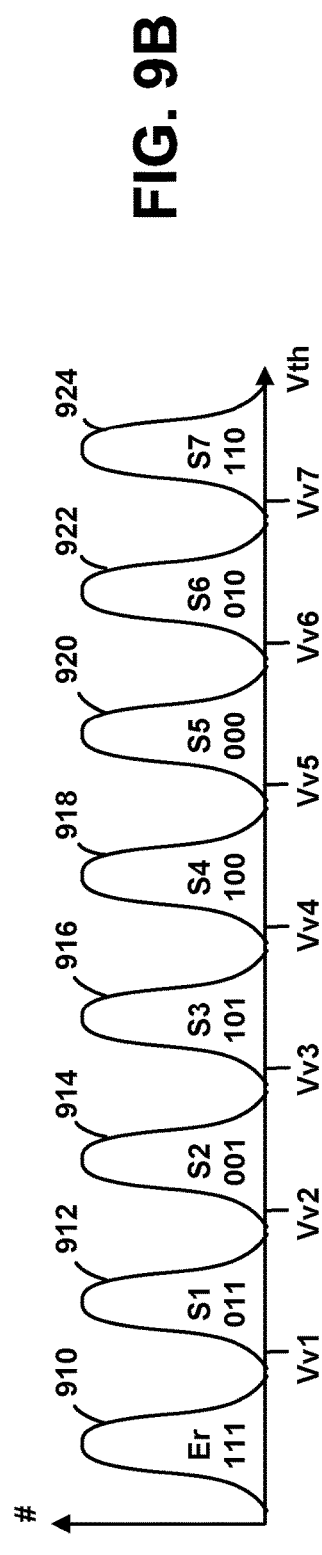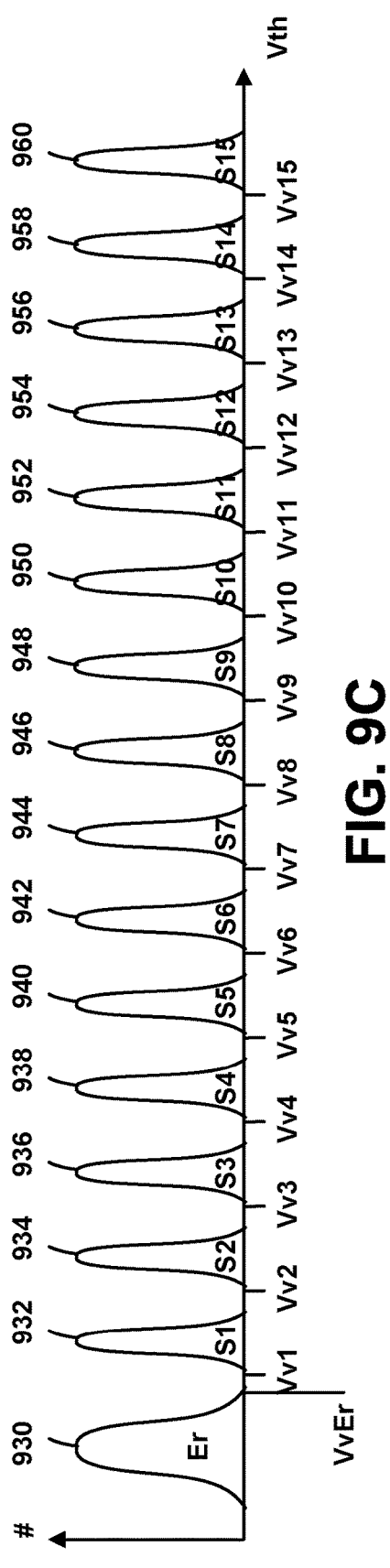

|     | Er | S1 | S2 | S3 | S4 | S5 | S6 | S7 |
|-----|----|----|----|----|----|----|----|----|
| DL3 | 1  | 0  | 0  | 1  | 1  | 0  | 0  | 1  |
| DL2 | 1  | 1  | 0  | 0  | 0  | 0  | 1  | 1  |
| DL1 | 1  | 1  | 1  | 1  | 0  | 0  | 0  | 0  |
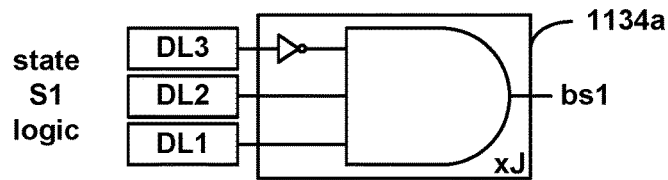
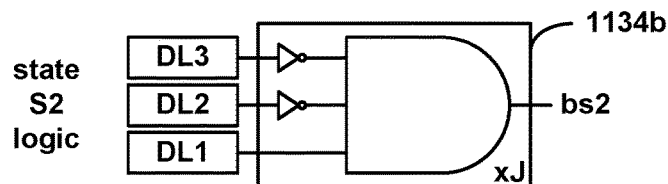
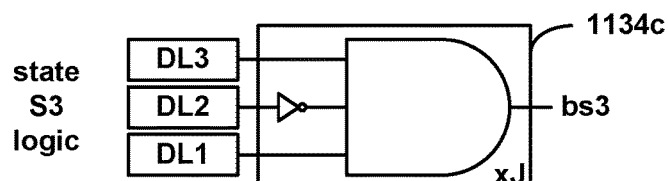
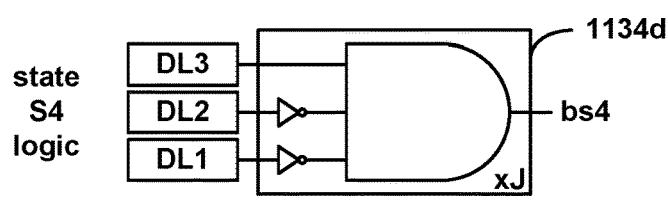
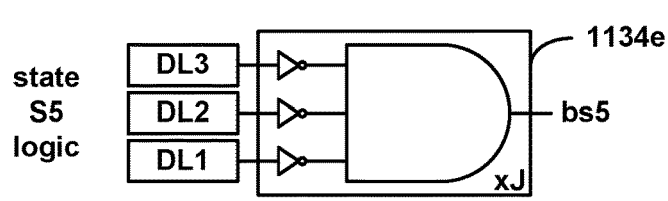
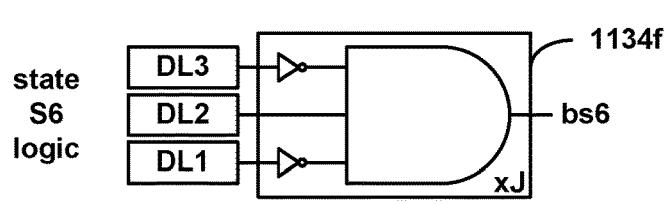
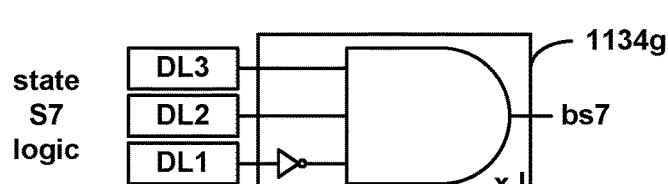
FIG. 11C

DYNAMIC BIT-SCAN TECHNIQUES FOR MEMORY DEVICE PROGRAMMING

PRIORITY CLAIM

This application is a divisional of U.S. patent application Ser. No. 16/000,413 entitled "DYNAMIC BIT-SCAN TECHNIQUES FOR MEMORY DEVICE PROGRAMMING," filed Jun. 5, 2018, which is incorporated by reference herein in its entirety for all purposes.

BACKGROUND

The present technology relates to memory devices.

Semiconductor memory devices have become more popular in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a memory state. A charge-trapping material can be arranged vertically in a three-dimensional stacked memory structure, or horizontally in a two-dimensional memory structure. One example of a three-dimensional memory structure is the Bit Cost Scalable (BiCS) architecture which includes a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 9A depicts an embodiment of threshold voltage distributions for a four-state memory device in which each memory cell stores two bits of data.

FIG. 9B depicts an embodiment of threshold voltage distributions for an eight-state memory device in which each memory cell stores three bits of data.

FIG. 9C depicts an embodiment of threshold voltage distributions for a sixteen-state memory device in which each memory cell stores four bits of data.

FIG. 11C is a diagram of an embodiment of state S1-S7 logic circuits of FIG. 11B.

DETAILED DESCRIPTION

Figure 1A:
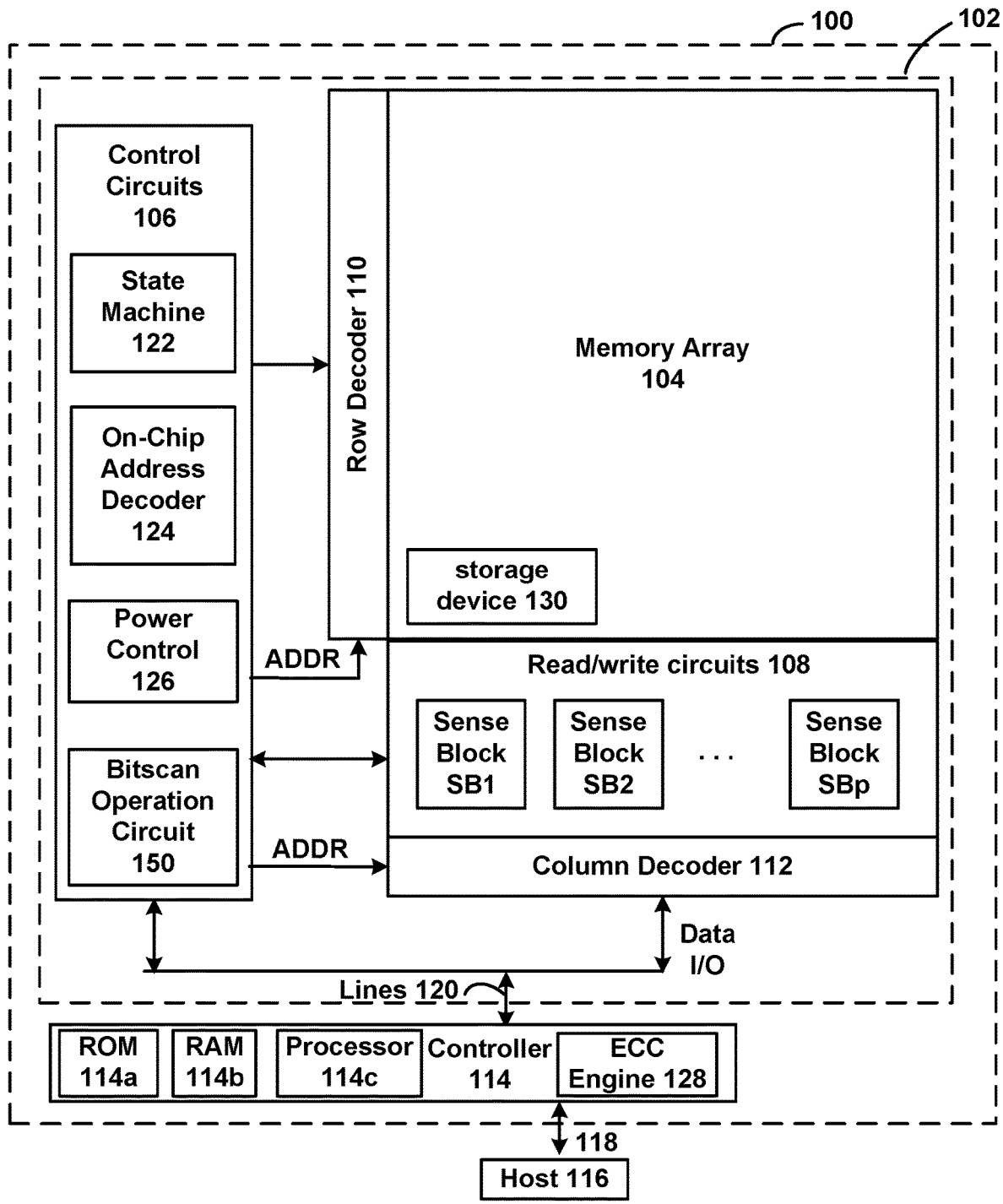
FIG. 1A is a block diagram of an example memory device.

Techniques are provided for programming a memory device. A corresponding memory device also is provided.

A programming operation for a group of memory cells typically involves providing the memory cells in an erased state and then applying a series of program pulses to the memory cells. Each program pulse is provided in a program loop, also referred to as a program-verify iteration. For example, the program pulse may be applied to a word line that is connected to control gates of the memory cells. In one approach, incremental step pulse programming is performed, in which the program pulse amplitude is increased by a step size in each program loop. Verify operations may be performed after each program pulse to determine whether the memory cells have completed programming. When programming has completed for a memory cell, the memory cell can be locked out from further programming while programming continues for other memory cells in subsequent program loops.

Each memory cell may be associated with a memory state according to write data in a program command. As used herein, a "memory state" is a detectable characteristic of a memory cell (e.g., a threshold voltage of a NAND memory cell, a resistance of a ReRAM memory cell, a magnetization state of a magnetoresistive random access memory) that may be used to represent a data value, such as a binary data value. As used herein, the detectable characteristic of a memory cell used to represent a data value is referred to as a "programming characteristic." Based on write data in a program command, a memory cell will either remain in the erased state or be programmed to a memory state (a programmed memory state) different from the erased state.

For example, in a two-bit per cell memory device, there are four memory states including the erased state and three programmed memory states. In a three-bit per cell memory device, there are eight memory states including the erased state and seven programmed memory states. In a four-bit per cell memory device, there are sixteen memory states including the erased state and fifteen programmed memory states.

When a program command is issued, the write data are stored in data latches associated with the memory cells. For example, in a two-bit per cell memory device, each memory cell is associated with two data latches (e.g., DL1, DL2) that store the two-bit write data for the memory cell. Likewise, in a three-bit per cell memory device, each memory cell is associated with three data latches (e.g., DL1, DL2, DL3) that store the three-bit write data for the memory cell. Similarly, in a four-bit per cell memory device, each memory cell is associated with four data latches (e.g., DL1, DL2, DL3, DL4) that store the four-bit write data for the memory cell.

During programming, the data latches of a memory cell can be read to determine the memory state to which the cell is to be programmed. For NAND memory cells, each programmed memory state is associated with a verify voltage. A NAND memory cell with a given memory state is considered to have completed programming when a sensing operation determines the threshold voltage (Vth) of the memory cell is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

In addition to the verify operations described above, a bitscan operation also may be performed to determine when programming is complete for a group of memory cells. As used herein, a "bitscan" is an operation that counts a number of memory cells whose programming characteristic has not shifted above a particular verify voltage level for a particular memory state. For NAND memory cells, a bitscan is an operation that counts a number of memory cells whose threshold voltage has not shifted above a particular verify voltage level for a particular memory state. For example, a state N bitscan is a count of a number of state N memory cells whose threshold voltage has not shifted above a verify voltage level for state N. Likewise, a state (N+1) bitscan is a count of a number of state (N+1) memory cells whose threshold voltage has not shifted above a verify voltage level for state (N+1), and so on. For simplicity, the following discussion will refer to bitscan operations for NAND memory cells. Persons of ordinary skill in the art will understand that bitscan operations also may be used for other non-volatile memory technologies.

Programming of memory cells for a particular memory state may be considered complete if the bitscan count for a particular state is less than a predetermined value. In some embodiments, the predetermined value is less than a number of read errors that can be corrected by an error correction code engine. In other words, programming of memory cells for a particular memory state may be considered complete even though all memory cells that are to be programmed to the particular memory state do not have threshold voltages that have shifted above a verify voltage level for the memory state, as long as the number of "failing" memory cells is less than a number of read errors that can be corrected by an error correction code engine.

Bitscan calculations typically are performed based on results of verify operations for a particular program-verify iteration. In particular, following application of a program pulse, verify operations may be performed for one or more memory states, and then results of the verify operations may be used to calculate the bitscan for a particular memory state.

In some programming techniques, following each program pulse, a bitscan is performed for a single memory state (a "single-state bitscan"), and bitscans for higher memory states are not performed until the bitscan count for the lower memory state is less than the predetermined value. Under some circumstances, performing such single-state bitscans may result in extra verify operations being performed and extra program pulses being applied to the memory cells, even though the memory cells have actually completed programming. This is undesirable because time is consumed performing verify operations, and applying unnecessary program pulses may cause program disturb.

In other programming techniques, following each programming pulse, a bitscan is performed for multiple (e.g., n) consecutive memory states (an "n-state bitscan"). Under some circumstances, performing such n-state bitscans also may result in extra verify operations being performed and extra program pulses being applied to the memory cells, even though the memory cells have actually completed programming. As in the case of single-state bitscans, this is undesirable because time is consumed performing verify operations, and applying unnecessary program pulses may cause program disturb.

Technology is described for performing dynamic variable state bitscans that repeatedly switch between performing an n-state bitscan (e.g., bitscans performed for n consecutive memory states) after each programming pulse until first predetermined criteria are satisfied, and performing an m-state bitscan (e.g., bitscans performed for m consecutive memory states) after each programming pulse until second predetermined criteria are satisfied, with m>n and n>0. In addition, technology is described for selectively performing a single state bitscan or a dynamic variable state bitscan after each of multiple programming pulses based on a determined average threshold voltage change per applied programming pulse. Various other features and benefits are described below.

FIG. 1A is a block diagram of an example memory device 100. Memory device 100 may include one or more memory die 102. Memory die 102 includes a memory array 104 of memory cells, control circuits 106, and read/write circuits 108. Memory array 104 is addressable by word lines via a row decoder 110 and by bit lines via a column decoder 112. Read/write circuits 108 include multiple sense blocks SB1, SB2, . . . , SBp and allow a page of memory cells to be read or programmed in parallel. Memory device 100 also may include a controller 114. Commands and data are transferred between a host 116 and controller 114 via a data bus 118, and between controller 114 and the one or more memory die 102 via lines 120.

Memory array 104 can be two-dimensional or three-dimensional. Memory array 104 may include one or more arrays of memory cells. Memory array 104 may include a monolithic three dimensional memory structure in which multiple memory levels are formed above (and not in) a single substrate, such as a wafer, with no intervening substrates. Memory array 104 may include any type of non-volatile memory that is monolithically formed in one or more physical levels of arrays of memory cells having an active area disposed above a silicon substrate. Memory array 104 may be a non-volatile memory device having circuitry associated with the operation of the memory cells, whether the associated circuitry is above or within the substrate.

Control circuits 106 cooperate with read/write circuits 108 to perform memory operations on memory array 104, and includes a state machine 122, an on-chip address decoder 114, and a power control module 126. State machine 122 provides chip-level control of memory operations. On-chip address decoder 124 provides an address interface between addresses used by a host or a memory controller to the hardware address used by row decoder 110 and column decoder 112. Power control module 126 controls the power and voltages supplied to the word lines and bit lines during memory operations, and can include drivers for word lines, SGS and SGD transistors and source lines. Sense blocks SB1, SB2, . . . , SBp can include bit line drivers, in one approach.

In embodiments, some of the components can be combined. In various designs, one or more of the components (alone or in combination), other than memory array 104, can function as a control circuit that is configured to perform the actions described herein. For example, a control circuit may include one or more of control circuits 106, read/write circuits 108, row decoder 110, column decoder 112, controller 114, state machine 122, power control module 126, bitscan operation circuit 150 and sense blocks SBb, SB2, . . . , SBp.

The control circuits can include a programming circuit configured to perform a programming operation for memory cells. The programming operation includes a plurality of program-verify iterations, and in each program-verify iteration the programming circuit applies one or more programming pulses to the memory cells. The control circuits also can include a scanning circuit configured to repeatedly switch between performing an n-state bitscan after each programming pulse until first predetermined criteria are satisfied, and performing an m-state bitscan after each programming pulse until second predetermined criteria are satisfied, where m>n, and n>0.

The control circuits also can include a first counting circuit configured to count a number of memory cells that have not been programmed to a desired memory state for each of n memory states, and a second counting circuit configured to count a number of memory cells that have not been programmed to a desired memory state for each of m memory states.

The control circuits also can include a first bitscan circuit configured to perform a single state bitscan after each of multiple programming pulses, and a second bitscan circuit configured to perform a dynamic variable state bitscan by counting bits state-by-state after each of multiple programming pulses. In embodiments, the first bitscan circuit and the second bitscan circuit may be different circuits or the same circuit.

The control circuits also can include a bitscan selection circuit configured to selectively activate the first bitscan circuit or the second bitscan circuit based on an average memory cell threshold voltage change per programming pulse.

The control circuits also can include a bitscan selection circuit configured to activate the first bitscan circuit if an average memory cell threshold voltage change per programming pulse is less than a predetermined value, and activate the second bitscan circuit if the average memory cell threshold voltage change per programming pulse is greater than or equal to the predetermined value.

Figure 1B:
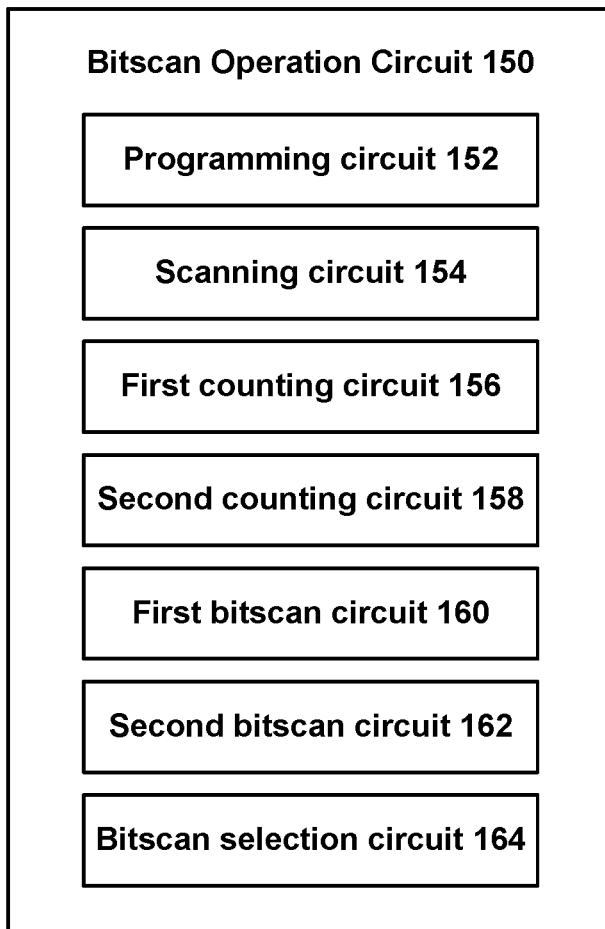
FIG. 1B is a block diagram of an example bitscan operation circuit.

For example, FIG. 1B is a block diagram of an example bitscan operation circuit 150 that includes a programming circuit 152, a scanning circuit 154, a first counting circuit 156, a second counting circuit 158, a first bitscan circuit 160, a second bitscan circuit 162 and a bitscan selection circuit 164. Programming circuit 152 may include software, firmware and/or hardware which implements, e.g., steps 1102-1120 of FIG. 11A.

Figure 1C:
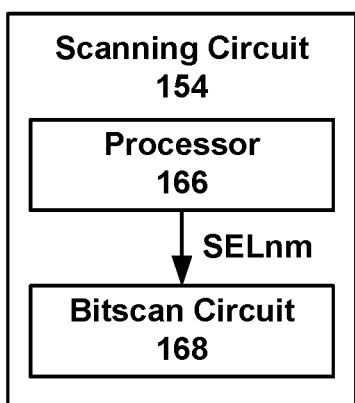
FIG. 1C is a block diagram of an example scanning circuit of FIG. 1B.
Figure 11B:
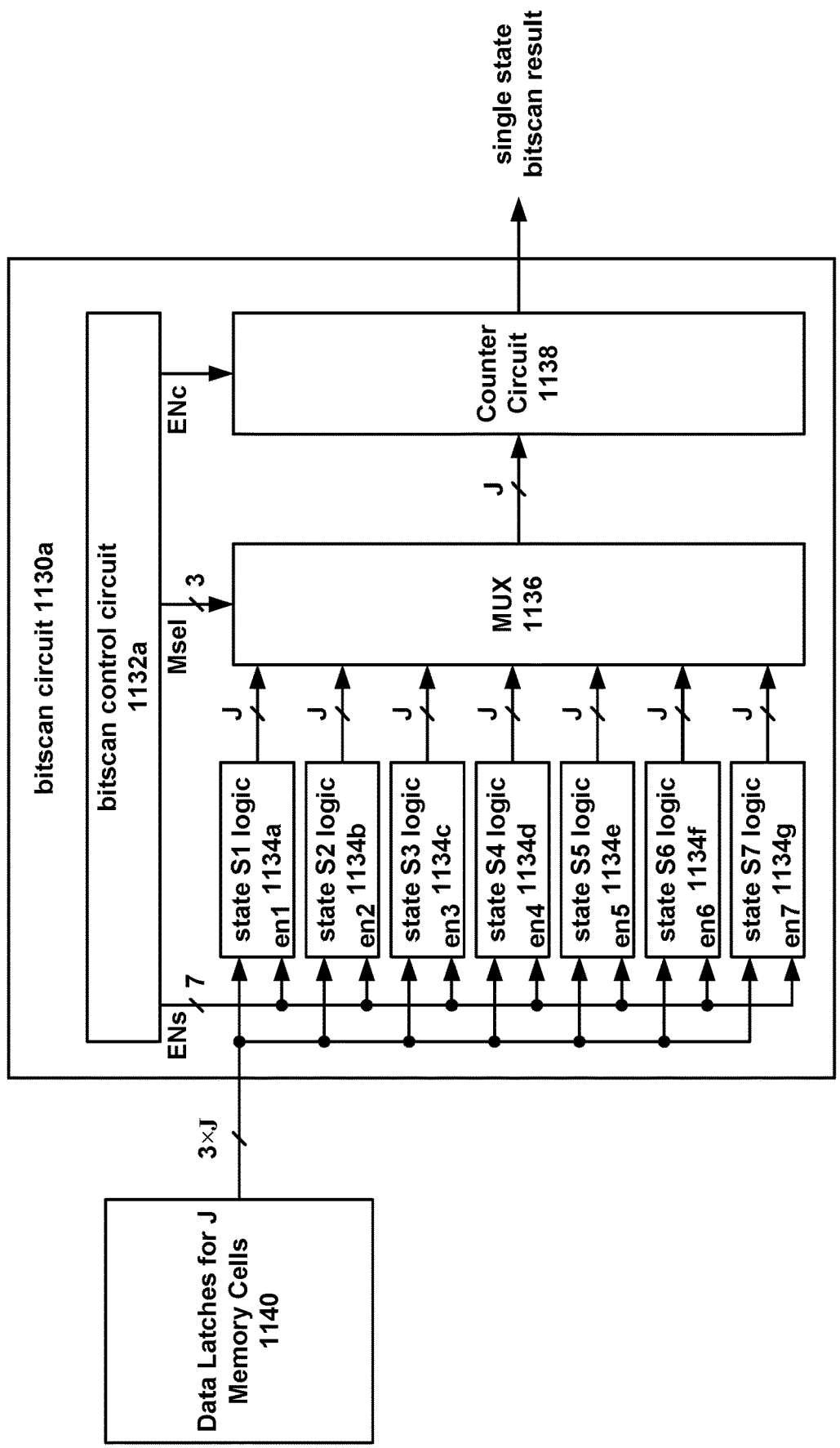
FIG. 11B is a high level block diagram of an embodiment of a bitscan circuit.
Figure 11D:
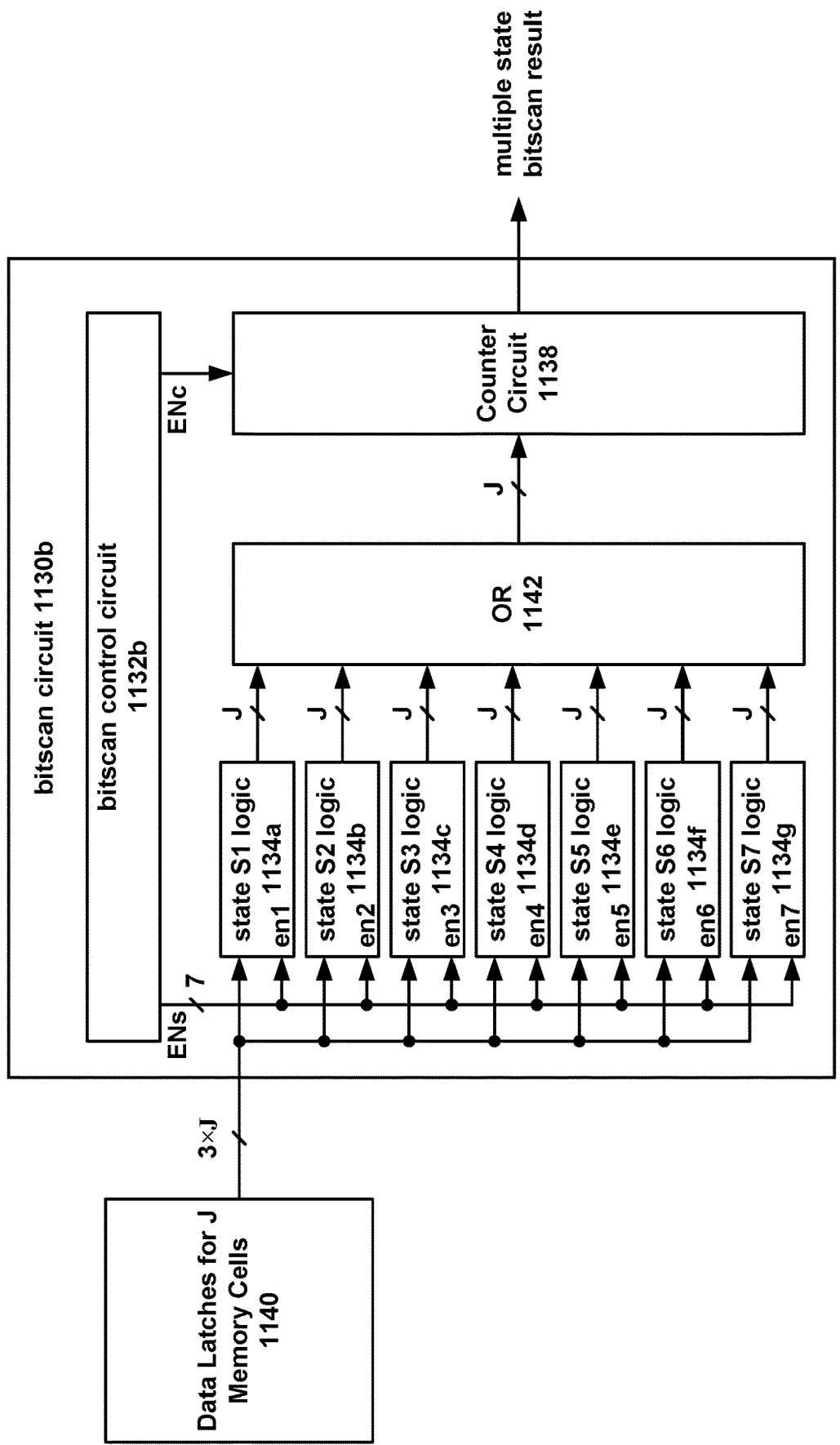
FIG. 11D is a high level block diagram of another embodiment of a bitscan circuit.
Figure 12A:
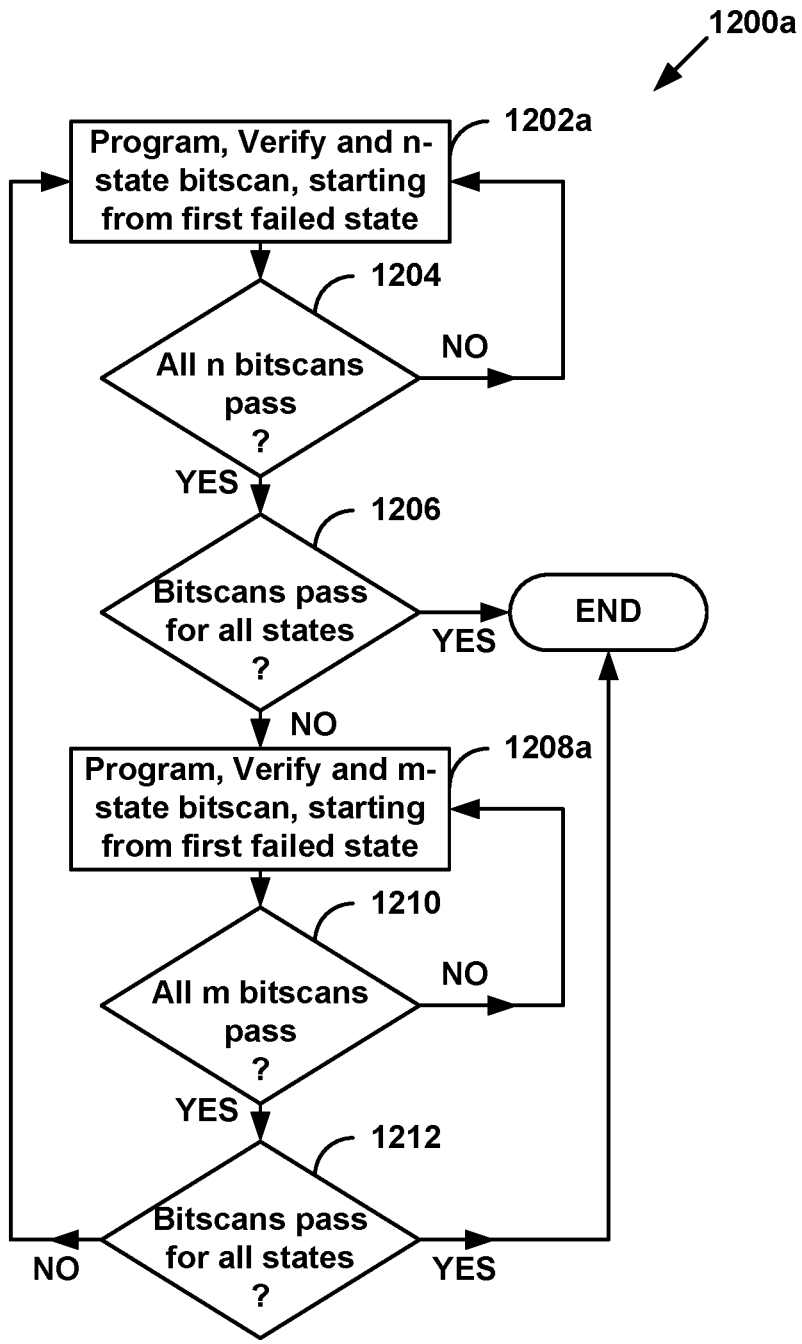
FIG. 12A is a flowchart of an example programming process in a memory device.
Figure 12B:
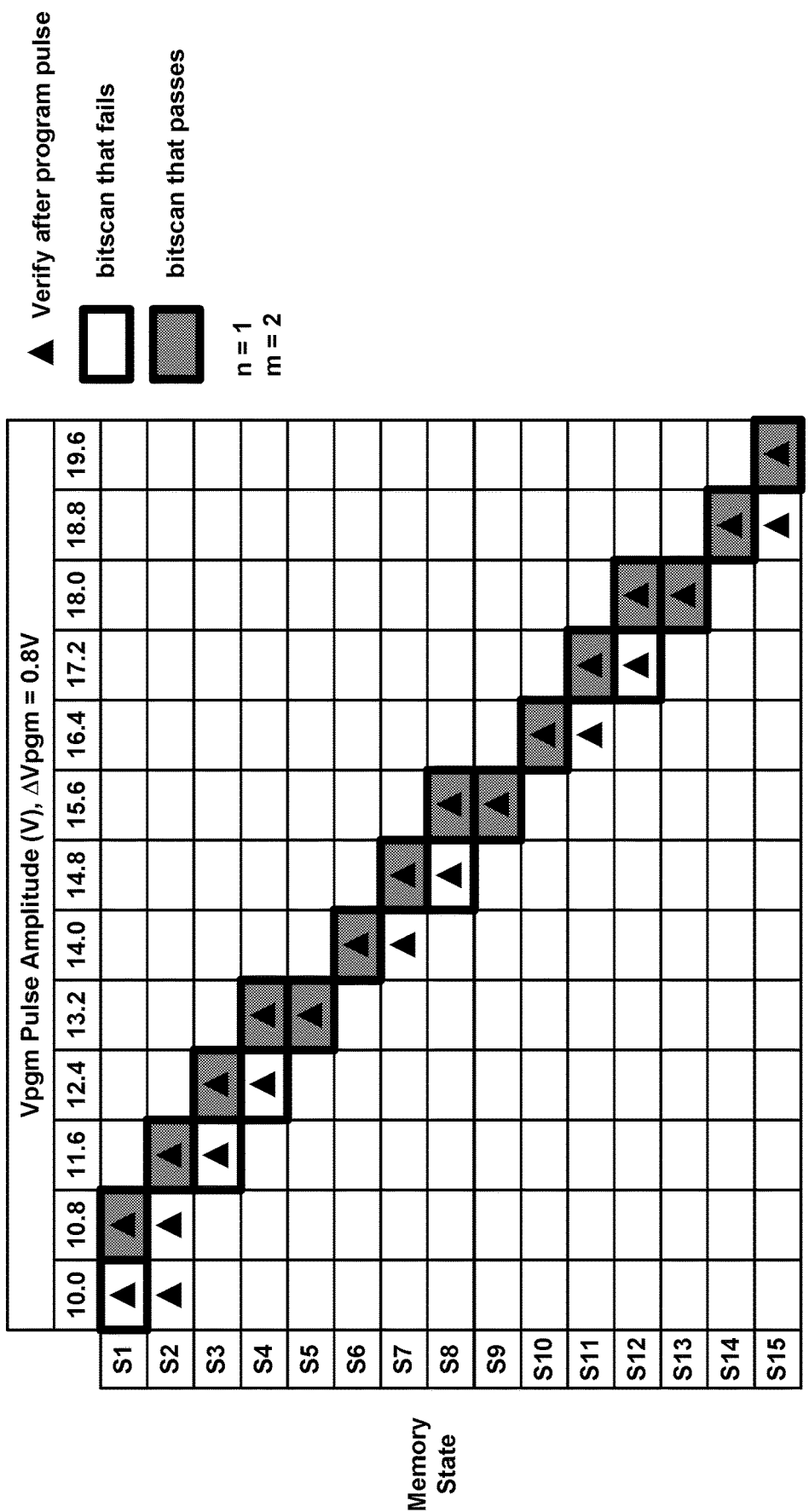
FIG. 12B depicts results of an example operation of the process of FIG. 12A.
Figure 12C:
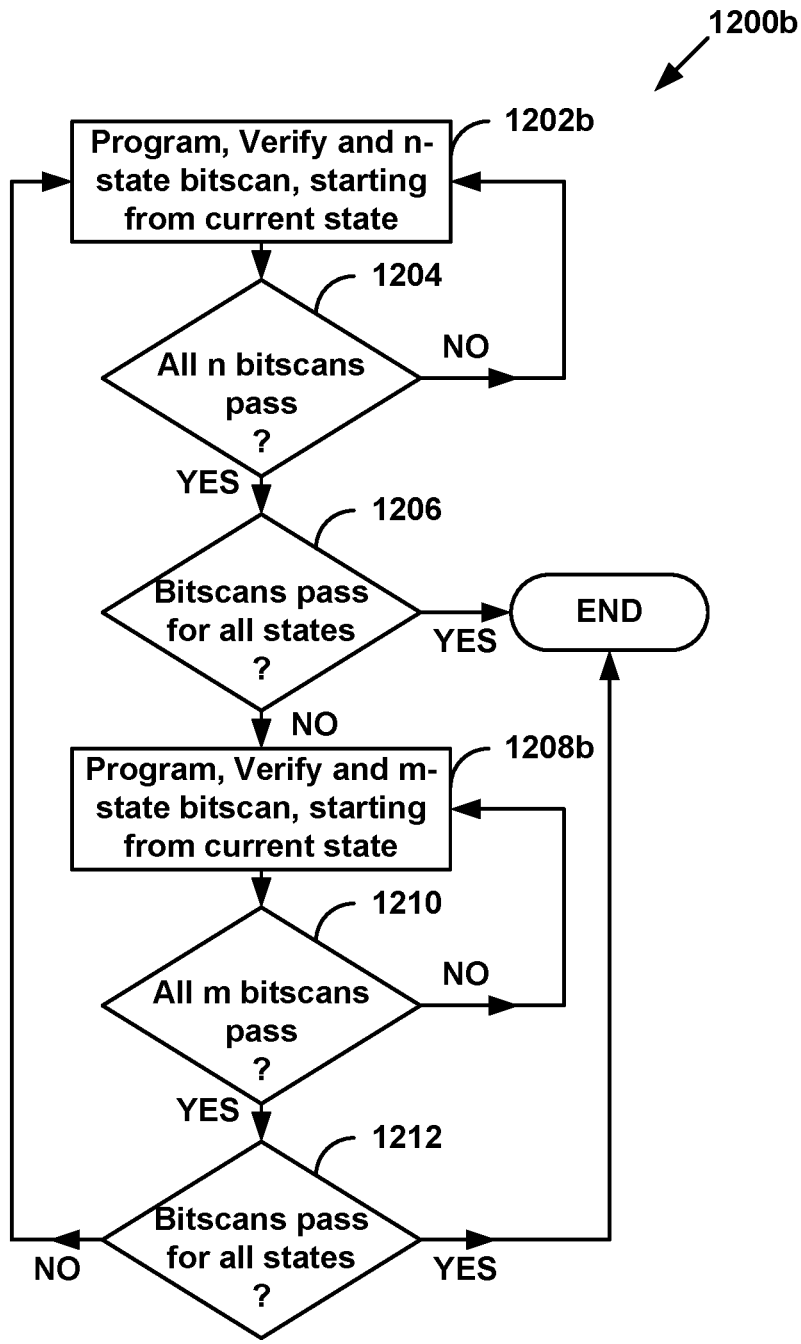
FIG. 12C is a flowchart of another example programming process in a memory device.

Scanning circuit 154 may include software, firmware and/or hardware which implements, e.g., steps 1202a-1212 of FIG. 12A and steps 1202b-1212 of FIG. 12C. For example, FIG. 1C depicts an embodiment of a scanning circuit 154, which includes a processor 166 and a bitscan circuit 168. In embodiments, a storage device (e.g., storage device 130 of memory array 104) includes code such as a set of instructions, and processor 166 is operable to execute the set of instructions to provide a control signal SELnm to bitscan circuit 168 to repeatedly switch between performing an n-state bitscan after each programming pulse until first predetermined criteria are satisfied, and performing an m-state bitscan after each programming pulse until second predetermined criteria are satisfied, where m>n, and n>0. In embodiments, bitscan circuit 168 may be one or more of example bitscan circuit 1130a of FIG. 11B or bitscan circuit 1130b of FIG. 11D.

First counting circuit 156 may include software, firmware and/or hardware which implements, e.g., step 1202a of FIG. 12A and step 1202b of FIG. 12C. In embodiments, first counting circuit 156 may be one or more of example bitscan circuit 1130a of FIG. 11B or bitscan circuit 1130b of FIG. 11D.

Second counting circuit 158 may include software, firmware and/or hardware which implements, e.g., step 1208a of FIG. 12A and step 1208b of FIG. 12C. In embodiments, second counting circuit 158 may be one or more of example bitscan circuit 1130a of FIG. 11B or bitscan circuit 1130b of FIG. 11D.

Figure 12D:
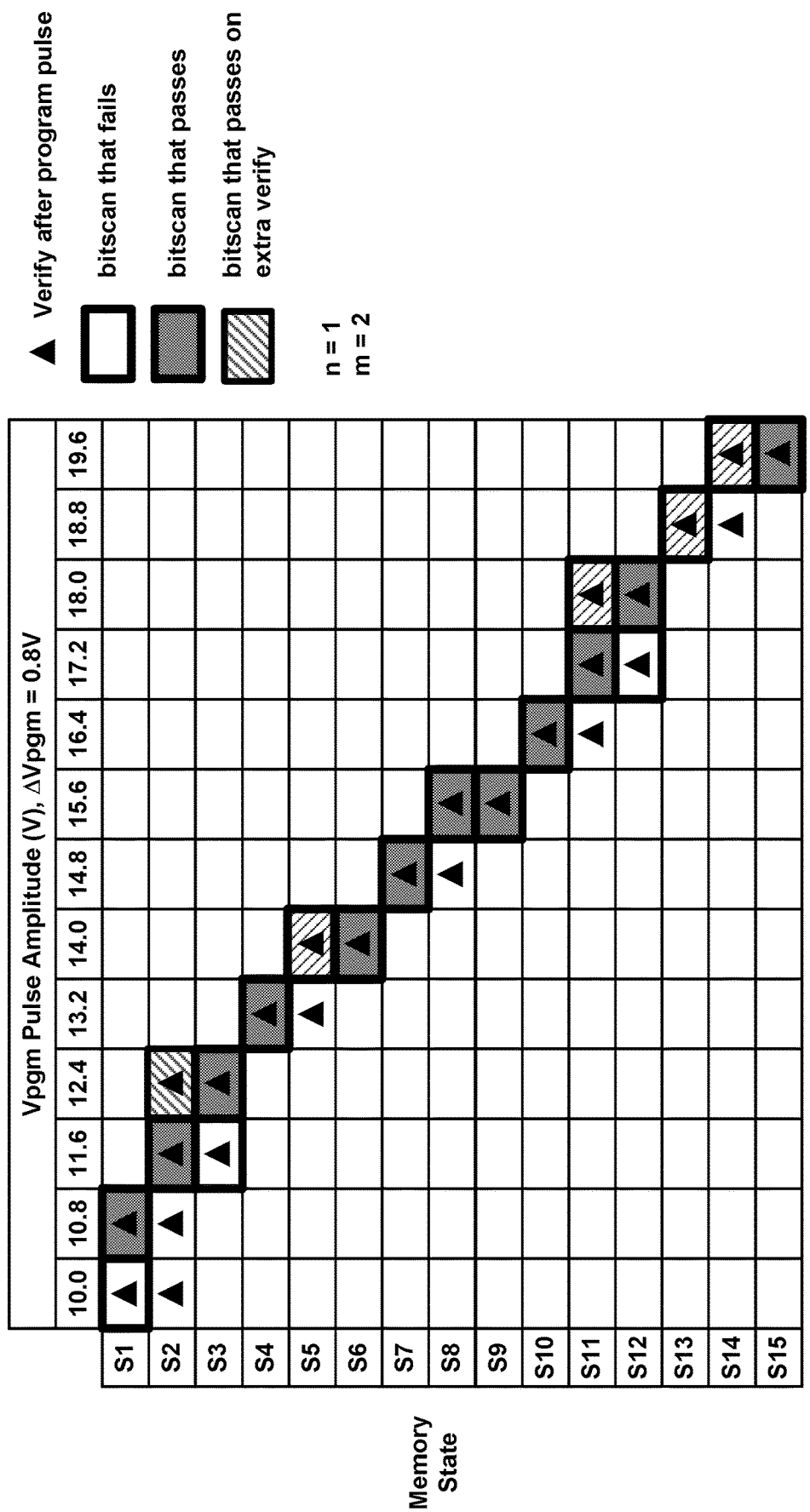
FIG. 12D depicts results of an example operation of the process of FIG. 12C.
Figure 12E:
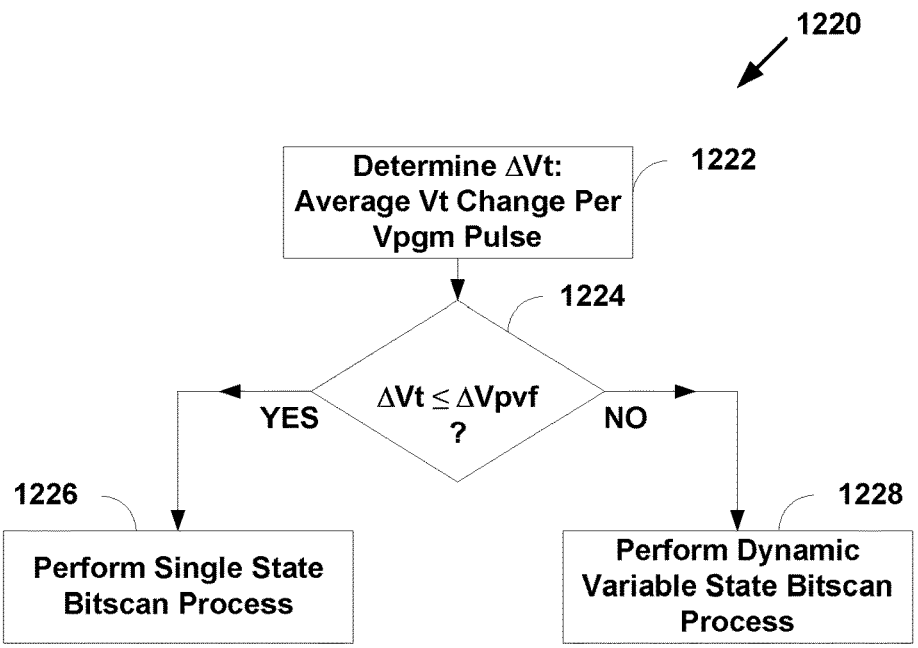
FIG. 12E is a flowchart of another example programming process in a memory device.

First bitscan circuit 160 may include software, firmware and/or hardware which implements, e.g., step 1226 of FIG. 12E, second bitscan circuit 162 may include software, firmware and/or hardware which implements, e.g., step 1228 of FIG. 12E, and bitscan selection circuit 164 may include software, firmware and/or hardware which implements, e.g., step 1224 of FIG. 12E.

Figure 1D:
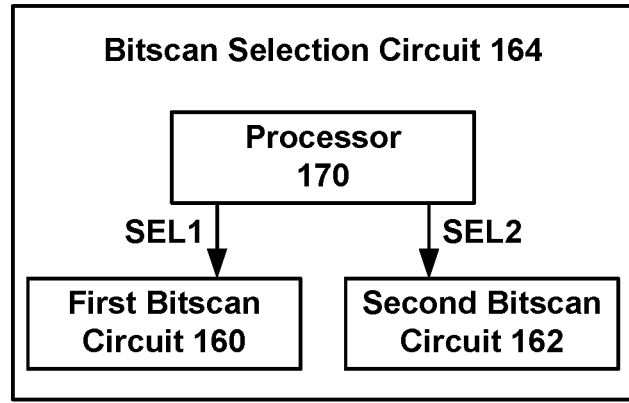
FIG. 1D is a block diagram of an example bitscan selection circuit of FIG. 1B.

For example, FIG. 1D depicts an embodiment of a bitscan selection circuit 164, which includes a processor 170, first bitscan circuit 160 and second bitscan circuit 162. In embodiments, first bitscan circuit 160 may be example bitscan circuit 1130a of FIG. 11B or bitscan circuit 1130b of FIG. 11D. In embodiments, second bitscan circuit 162 may be one or more of example bitscan circuit 1130a of FIG. 11B. In embodiments, first bitscan circuit 160 and second bitscan circuit 162 may be different circuits or the same circuit.

In embodiments, a storage device (e.g., storage device 130 of memory array 104) includes code such as a set of instructions, and processor 170 is operable to execute the set of instructions to provide a control signal SEL1 to first bitscan circuit 160 and a control signal SEL2 to selectively activate first bitscan circuit 160 or second bitscan circuit 162 based on an average memory cell threshold voltage change per programming pulse.

In embodiments, a storage device (e.g., storage device 130 of memory array 104) includes code such as a set of instructions, and processor 170 is operable to execute the set of instructions to provide a control signal SEL1 to activate first bitscan circuit 160 if an average memory cell threshold voltage change per programming pulse is less than a predetermined value, and to provide a control signal SEL2 to activate the second bitscan circuit if the average memory cell threshold voltage change per programming pulse is greater than or equal to the predetermined value.

Controller 114 may include storage devices (memory) such as ROM 114a and RAM 114b, a processor 114c, and an error-correction code (ECC) engine 128 that can correct a number of read errors.

In an embodiment, a storage device that includes code such as a set of instructions, and processor 114c is operable to execute the set of instructions to provide the functionality described herein. Alternatively or additionally, processor 114c can access code from a storage device 130 of memory array 104, such as a reserved area of memory cells in one or more word lines.

For example, code can be used by controller 114 to access memory array 104 such as for programming, read and erase operations. The code can include boot code and control code (e.g., a set of instructions). The boot code is software that initializes the controller during a booting or startup process and enables controller 114 to access memory array 104. The code can be used by controller 114 to control one or more memory structures. Upon being powered up, processor 114c fetches the boot code from ROM 114a or storage device 130 for execution, and the boot code initializes the system components and loads the control code into RAM 114b. Once loaded into RAM 114b, the control code is executed by processor 114c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In an embodiment, host 116 is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host also may include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material The exact type of memory cells in memory array 104 is not limited to the examples above. Many different types of memory array architectures or memory technologies can be used to form memory array 104. No particular non-volatile memory technology is required for purposes of the new claimed embodiments proposed herein. Other examples of suitable technologies for memory cells of memory array 104 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of memory array 104 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage, light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors including memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array also may have one or more memory layers at least partially within the single substrate. As a non-limiting example, the substrate may include a semiconductor such as silicon. In a monolithic three dimensional memory array, the layers constituting each memory device level of the array are typically formed on the layers of the underlying memory device levels of the array. However, layers of adjacent memory device levels of a monolithic three dimensional memory array may be shared or have intervening layers between memory device levels.

In addition, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry typically is required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
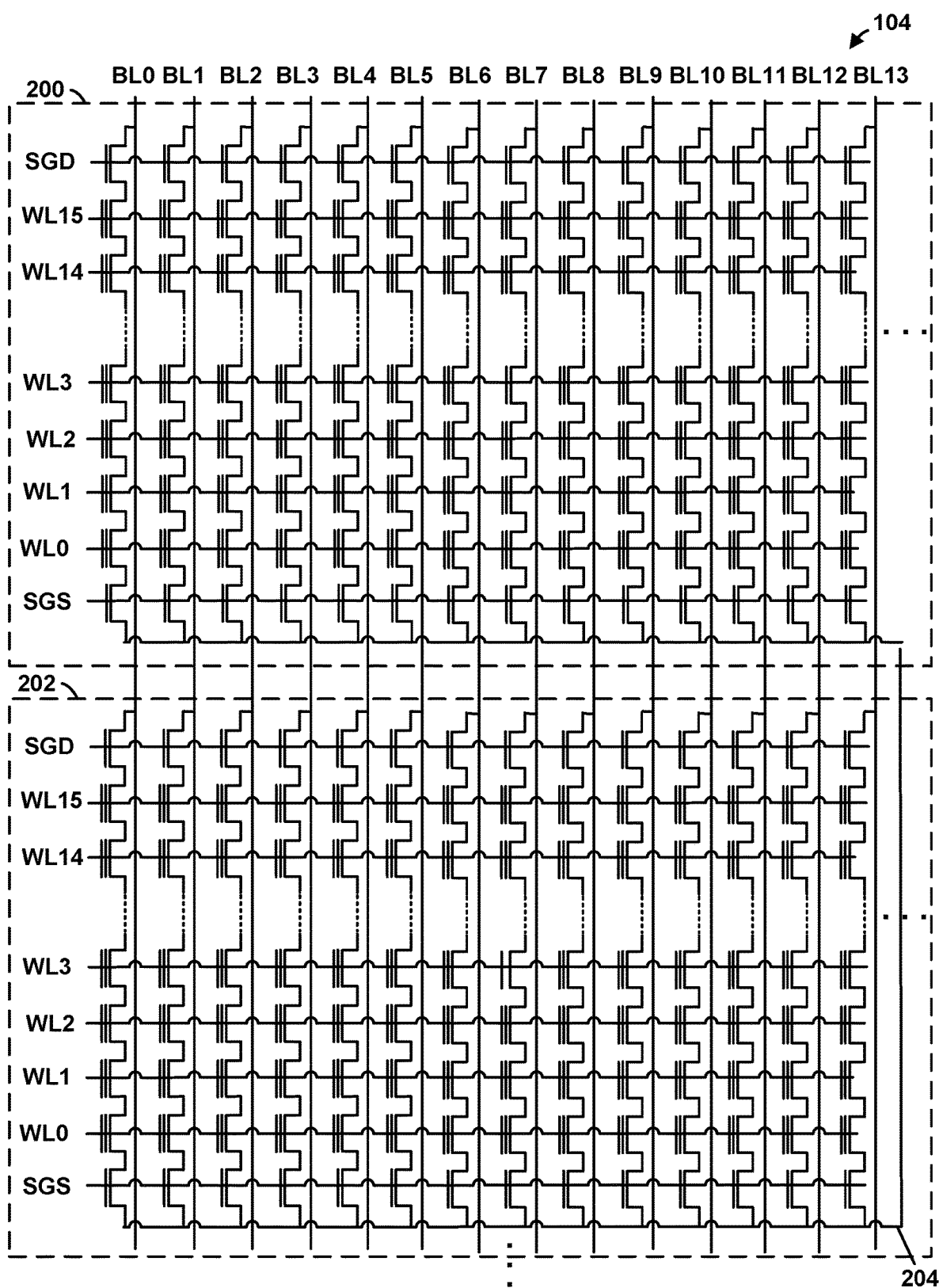
FIG. 2 depicts blocks of memory cells in an example two-dimensional configuration of the memory array of FIG. 1.

FIG. 2 depicts blocks of memory cells in an example two-dimensional configuration of memory array 104 of FIG. 1. Memory array 104 can include many blocks. Each example blocks 200 and 202 include a number of NAND strings and respective bit lines, e.g., BL0, BL1, . . . which are shared among the blocks. Each NAND string is connected at one end to a drain select gate (SGD) transistor, and are connected at their other end to a source select gate (SGS) transistor which, in turn, is connected to a common source line 204.

Control gates of the SGD transistors are connected via a common SGD line, and control gates of the SGS transistors are connected via a common SGS line. Sixteen word lines, for example, WL0-WL15, extend between the SGD transistors and the SGS transistors. In some cases, dummy word lines, which contain no user data, also can be used in the memory array adjacent to the SGD/SGS transistors. Such dummy word lines can shield the edge data word line from certain edge effects.

Figure 3A:
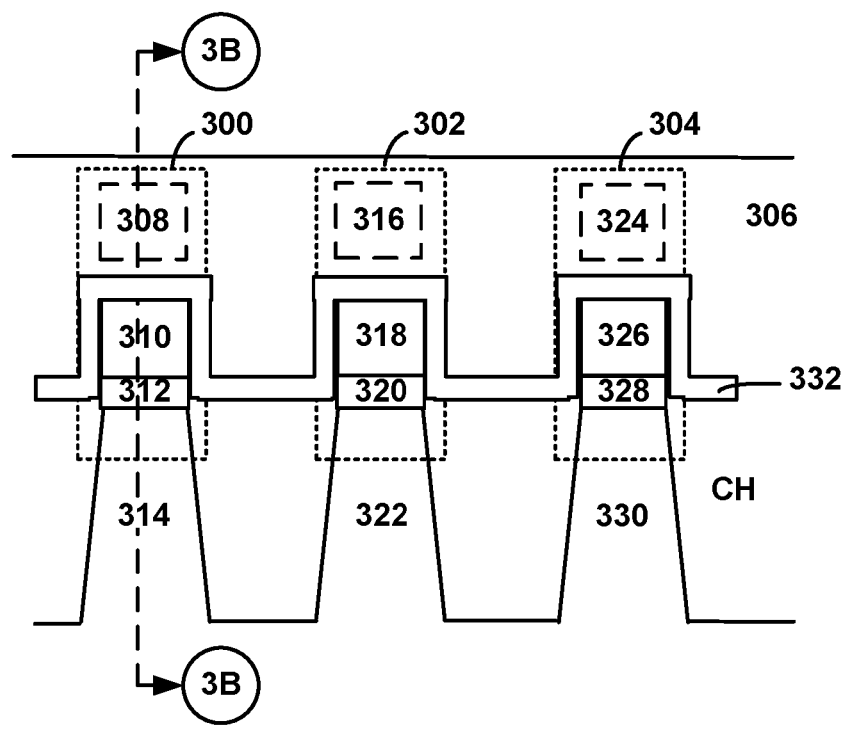
FIGS. 3A-3B depict cross-sectional views of example floating gate memory cells in NAND strings.
Figure 3B:
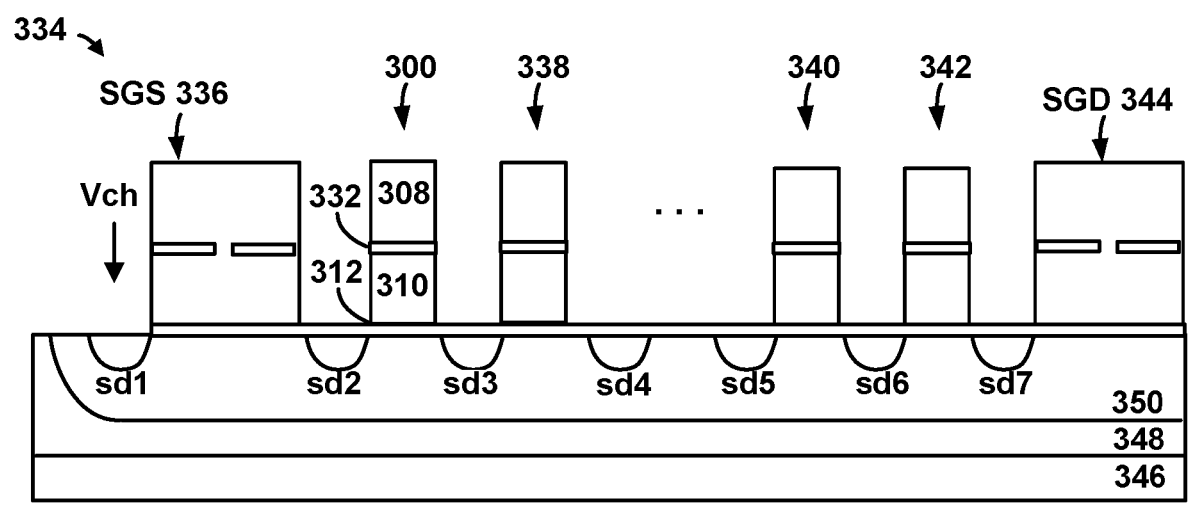

A floating gate memory is one type of non-volatile memory which may be provided in memory array 104. FIGS. 3A-3B depict cross-sectional views of example floating gate memory cells (e.g., in memory array 104 of FIG. 1) in NAND strings. In FIG. 3A, a bit line or NAND string direction goes into the page, and a word line direction goes from left to right. FIG. 3A depicts memory cells 300, 302 and 304, each coupled to a word line 306. Memory cell 300 includes a control gate 308, a floating gate 310, a tunnel oxide layer 312 and a channel region 314. Memory cell 302 includes a control gate 316, a floating gate 318, a tunnel oxide layer 320 and a channel region 322. Memory cell 304 includes a control gate 324, a floating gate 326, a tunnel oxide layer 328 and a channel region 330. Each of memory cells 300, 320 and 304 is in a different respective NAND string. An inter-poly dielectric (IPD) layer 332 also is depicted. Control gates 308, 316 and 324 are portions of word line 306.

Referring to FIG. 3B, a NAND string 334 includes an SGS transistor 336, example memory cells 300, 338, . . . , 340 and 342, and an SGD transistor 344. Memory cell 300 includes control gate 308, IPD layer 332, floating gate 310 and tunnel oxide layer 312. Passageways in IPD layer 332 in the SGS and SGD transistors allow the control gate layers and floating gate layers to communicate. In an embodiment, the control gate and floating gate layers may be polysilicon and the tunnel oxide layer may be silicon oxide. IPD layer 332 can be a stack of nitrides (N) and oxides (O) such as in a N—O—N—O—N configuration.

NAND string 334 may be formed on a substrate which includes a p-type substrate region 346, an n-type well 348 and a p-type well 350. N-type source/drain diffusion regions sd1, sd2, sd3, sd4, sd5, sd6 and sd7 are formed in p-type well 350. A channel voltage, Vch, may be applied directly to the channel region of the substrate.

Figure 4A:
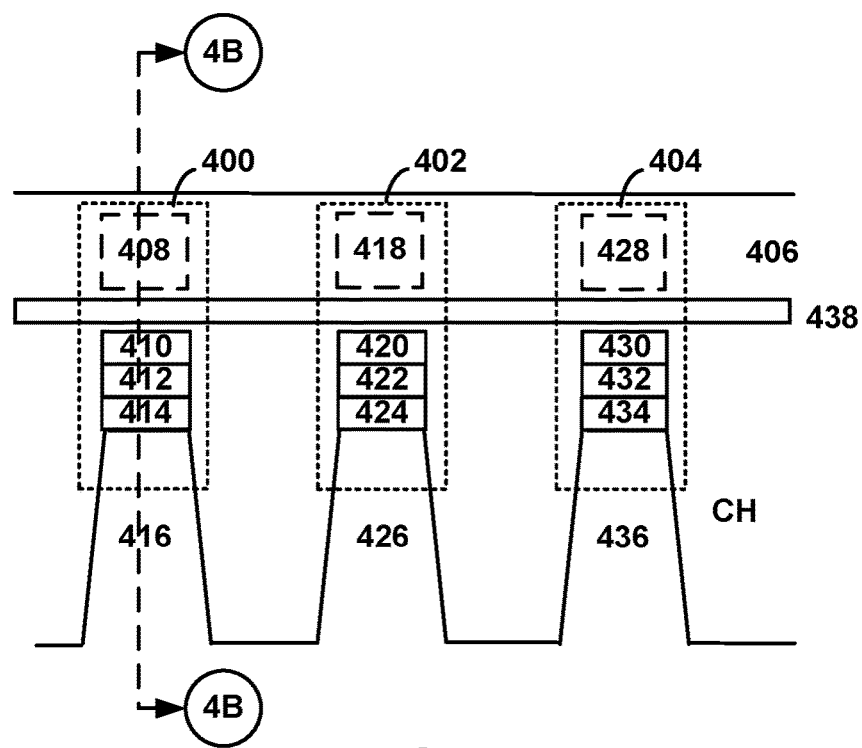
FIGS. 4A-4B depict cross-sectional views of example charge-trapping memory cells in NAND strings.
Figure 4B:
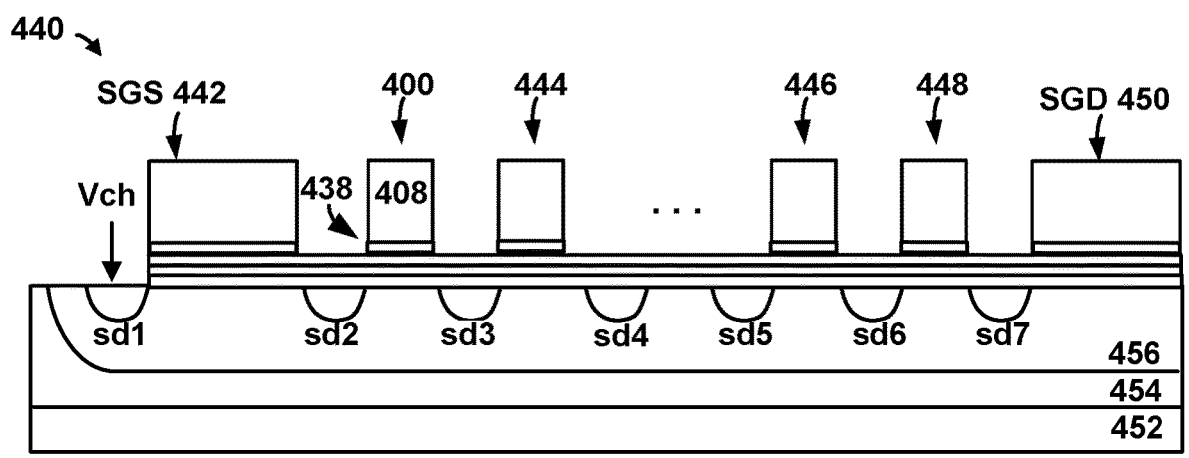

Another type of non-volatile memory is a charge-trapping memory cell that uses a non-conductive dielectric material to store charge. FIGS. 4A-4B depict cross-sectional views of example charge-trapping memory cells (e.g., in memory array 104 of FIG. 1) in NAND strings. In FIG. 4A, the view is in a word line direction. Charge-trapping memory technology uses an insulator such as an SiN film to store electrons, in contrast to a floating-gate MOSFET technology which uses a conductor such as doped polycrystalline silicon to store electrons.

FIG. 4A depicts memory cells 400, 402 and 404, each coupled to a word line 406. Memory cell 400 includes a control gate 408, a charge-trapping layer 410, a polysilicon layer 412, a tunneling layer 414 and a portion of a channel region 416. Memory cell 402 includes a control gate 418, a charge-trapping layer 420, a polysilicon layer 422, a tunneling layer 424 and a portion of a channel region 426. Memory cell 404 includes a control gate 428, a charge-trapping layer 430, a polysilicon layer 432, a tunneling layer 434 and a portion of the channel region 436.

As an example, word line 406 extends across NAND strings which include respective channel regions 416, 426 and 436. Portions of word line 406 provide control gates 408, 418 and 428. Below word line 406 is an IPD layer 438, charge-trapping layers 410, 420 and 430, polysilicon layers 412, 422 and 432 and tunneling layer layers 414, 424 and 434. Each of charge-trapping layers 410, 420 and 430 extends continuously in a respective NAND string.

Referring to FIG. 4B, a NAND string 440 includes an SGS transistor 442, memory cells 400, 444, . . . , 446 and 448, and an SGD transistor 450. NAND string 440 may be formed on a substrate which includes a p-type substrate region 452, an n-type well 454 and a p-type well 456. N-type source/drain diffusion regions sd1, sd2, sd3, sd4, sd5, sd6 and sd7 are formed in the p-type well 456. A channel voltage, Vch, may be applied directly to the channel region of the substrate. Memory cell 400 includes control gate 408 and the IPD layer 438 above charge-trapping layer 410, polysilicon layer 412, tunneling layer 414 and a channel region 416.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

In this example, the layers 410, 412 and 414 extend continuously in the NAND string. In another approach, portions of the layers 410, 412 and 414 which are between the control gates 408, 418 and 428 can be removed, exposing a top surface of the channel 416.

Figure 5:
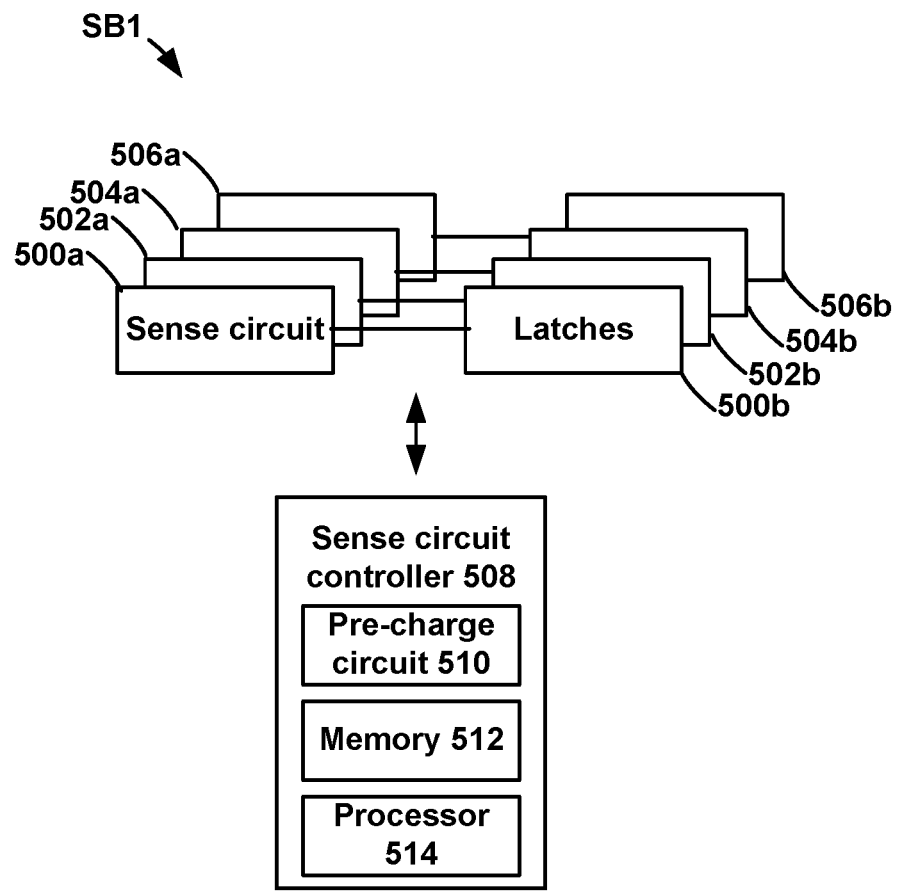
FIG. 5 depicts an example block diagram of the sense block SB1 of FIG. 1.

FIG. 5 depicts an example block diagram of the sense block SB1 of FIG. 1. Sense block includes multiple sense circuits 500a, 502a, 504a and 506a, associated with data latches 500b, 502b, 504b and 506b, respectively. Sense block SB1 also includes a sense circuit controller 508 which can communicate with sense circuits 500a, 502a, 504a and 506a and data latches 500b, 502b, 504b and 506b. Sense circuit controller 508 may include a pre-charge circuit 510, a memory 512 and a processor 514. Pre-charge circuit 510 provides a voltage to each of sense circuits 500a, 502a, 504a and 506a for setting a pre-charge voltage. Memory 512 may store code which is executable by processor 514 to perform the functions described herein. These functions can include reading data latches 500b, 502b, 504b and 506b, setting bit values in data latches 500b, 502b, 504b and 506b and providing voltages for setting pre-charge levels in sense nodes of sense circuits 500a, 502a, 504a and 506a.

Figure 6A:
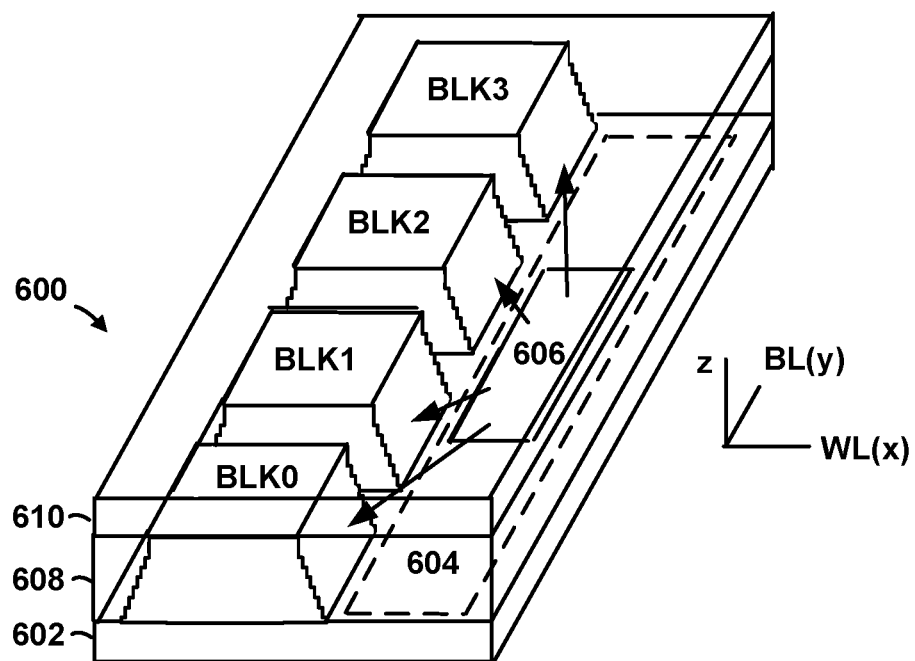
FIG. 6A is a perspective view of a set of blocks in an example three-dimensional configuration of the memory array of FIG. 1.

FIG. 6A is a perspective view of a set of blocks 600 in an example three-dimensional configuration of memory array 104 of FIG. 1. On a substrate 602 are example blocks BLK0, BLK1, BLK2 and BLK3 of memory cells and a peripheral area 604 with circuitry for use by blocks BLK0, BLK1, BLK2 and BLK3. For example, the circuitry can include voltage drivers 606 which can be connected to control gate layers of blocks BLK0, BLK1, BLK2 and BLK3. Substrate 602 also can include circuitry under blocks BLK0, BLK1, BLK2 and BLK3, and one or more lower metal layers which are patterned in conductive paths to carry signals of the circuitry.

In an embodiment, blocks BLK0, BLK1, BLK2 and BLK3 are formed in an intermediate region 608 of the memory device. In an upper region 610 of the memory device, one or more upper metal layers are patterned in conductive paths to carry signals of the circuitry. Each of blocks BLK0, BLK1, BLK2 and BLK3 includes a stacked area of memory cells, where alternating levels of the stack represent word lines. In an embodiment, each of blocks BLK0, BLK1, BLK2 and BLK3 has opposing tiered sides from which vertical contacts extend upward to an upper metal layer to form connections to conductive paths. Although four blocks BLK0, BLK1, BLK2 and BLK3 are depicted as an example, two or more blocks can be used, extending in the x- and/or y-directions.

In an embodiment, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
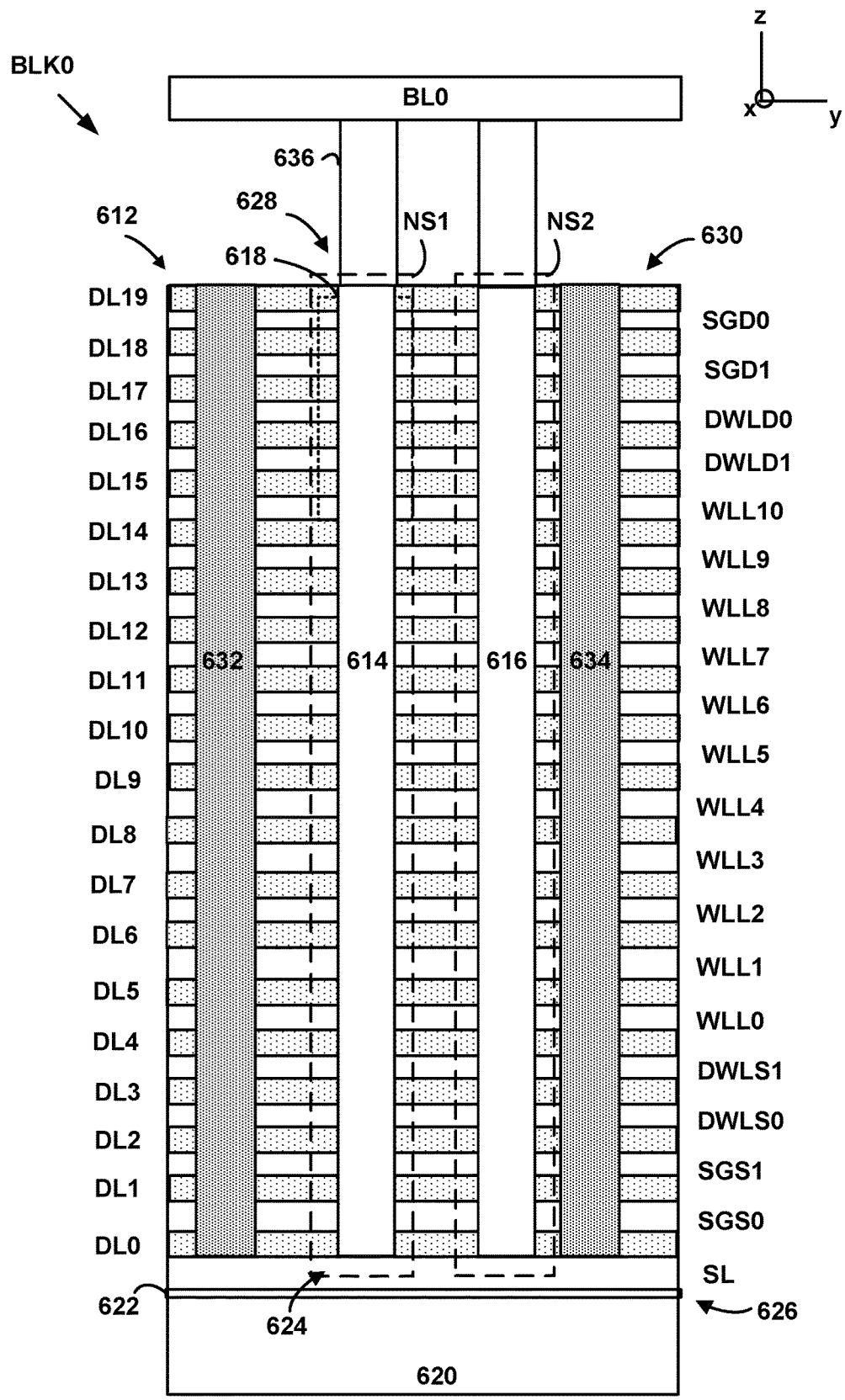
FIG. 6B depicts an example cross-sectional view of a portion of one of the blocks of FIG. 6A.

FIG. 6B depicts an example cross-sectional view of a portion of one of the blocks (e.g., BLK0) of FIG. 6A. Block BLK0 includes a stack 612 of alternating conductive and dielectric layers. In this example, the conductive layers include two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of stack 612 which include NAND strings NS1 and NS2 are depicted. Each NAND string encompasses a memory hole 614 or 616 which is filled with materials which form memory cells adjacent to the word lines. A region 618 of the stack is shown in greater detail in FIG. 6C.

Stack 612 includes a substrate 620, an insulating film 622 on substrate 620, and a portion of a source line SL. NS1 has a source-end 624 at a bottom 626 of stack 612 and a drain-end 628 at a top 630 of stack 612. Metal-filled slits 632 and 634 may be provided periodically across stack 612 as interconnects which extend through stack 612, such as to connect source line SL to a line above stack 612. Slits 632 and 634 may be used during the formation of the word lines and subsequently filled with metal. A portion of a bit line BL0 is also depicted. A conductive via 636 connects the drain-end 628 to BL0.

Figure 6C:
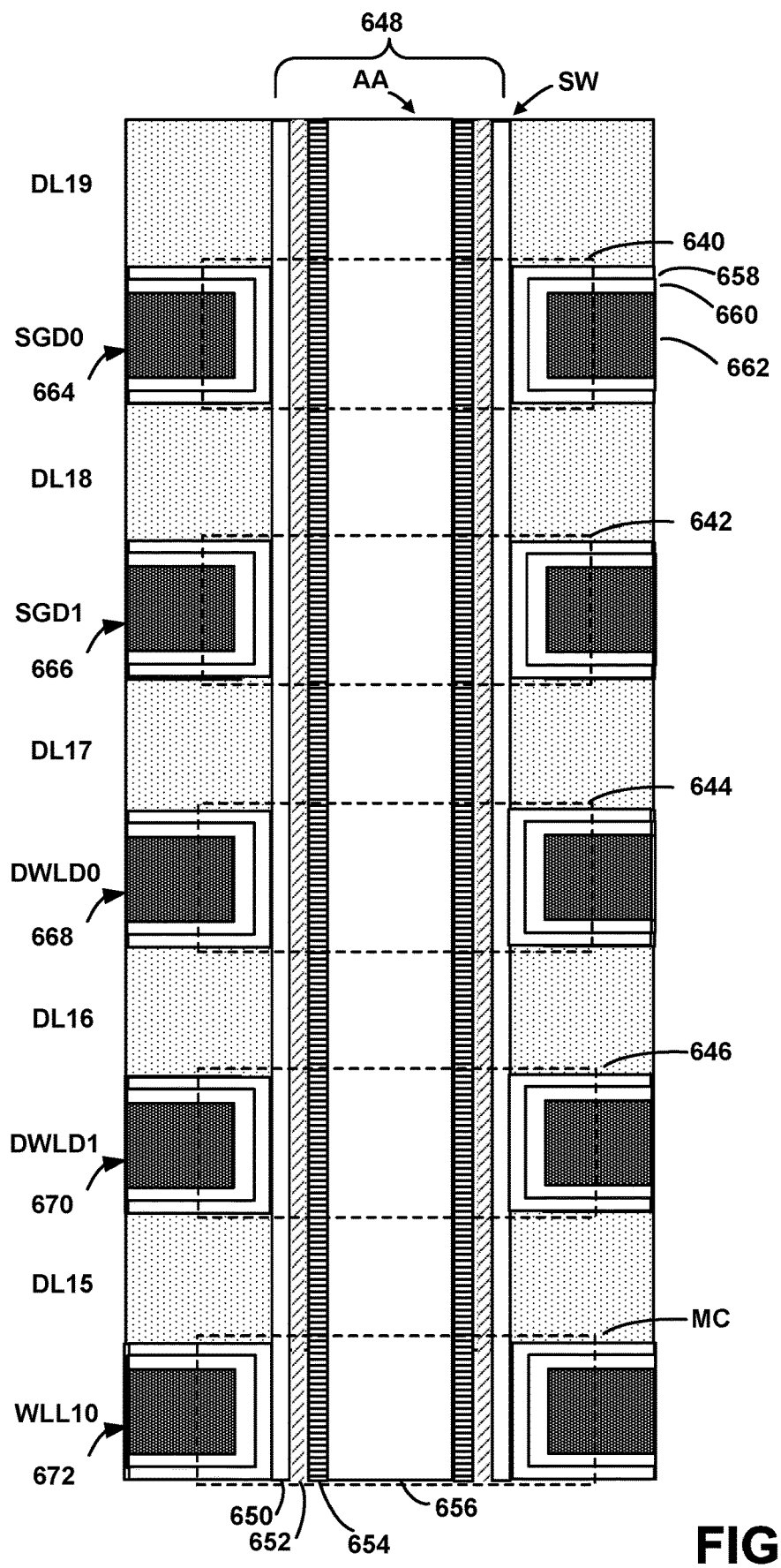
FIG. 6C depicts a close-up view of region 618 of the stack of FIG. 6B.

FIG. 6C depicts a close-up view of the region 618 of the stack of FIG. 6B. Memory cells are formed at the different levels of the stack at the intersection of a word line layer and a memory hole. In this example, SGD transistors 640 and 642 are provided above dummy memory cells 644 and 646 and a data memory cell MC. A number of layers can be deposited along the sidewall (SW) of the memory hole 648 and/or within each word line layer, e.g., using atomic layer deposition. For example, each column (e.g., the pillar which is formed by the materials within a memory hole) can include a charge-trapping layer or film 650 such as SiN or other nitride, a tunneling layer 652, a polysilicon body or channel 654, and a dielectric core 656.

A word line layer can include a blocking oxide/block high-k material 658, a metal barrier 660, and a conductive metal 662 such as tungsten as a control gate. For example, control gates 662, 664, 666, 668 and 670 are provided. In this example, all of the layers except the metal are provided in the memory hole. In other embodiments, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The threshold voltage (Vth) of a memory cell is increased in proportion to the amount of stored charge. During an erase operation, the electrons return to the channel.

Each of the memory holes can be filled with a plurality of annular layers including a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
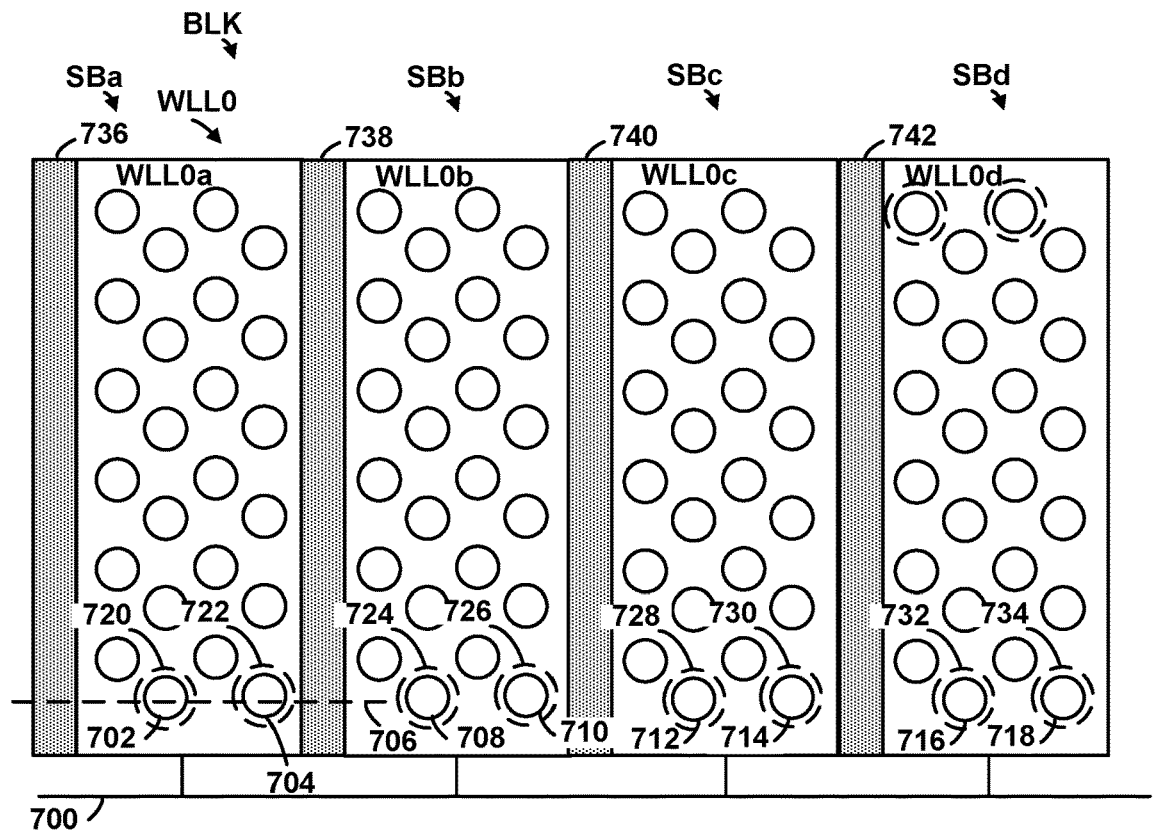
FIG. 7A depicts a top view of an example word line layer WLL0 of the stack of FIG. 6B.

FIG. 7A depicts a top view of an example word line layer WLL0 of stack 612 of FIG. 6B. As previously mentioned, a three-dimensional memory device can include a stack of alternating conductive and dielectric layers. The conductive layers provide the control gates of the SGS/SGD transistors and memory cells. The layers used for the SGS/SGD transistors are select gate layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block includes a set of NAND strings which have a common SGD control line (e.g., the SGD lines/control gates SGD0, SGD1, SGD2 and SGD3 in the sub-blocks SBa, SBb, SBc and SBd, respectively). Further, a word line layer in a block can be divided into regions. Each region is in a respective sub-block can extend between slits which are formed periodically in the stack to process the word line layers during the fabrication process of the memory device. This processing can include replacing a sacrificial material of the word line layers with metal.

Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figure and others are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0a, WLL0b, WLL0c and WLL0d which are each connected by a connector 700. The last region of a word line layer in a block can be connected to a first region of a word line layer in a next block, in one approach. Connector 700, in turn, is connected to a voltage driver for the word line layer.

Figure 7B:
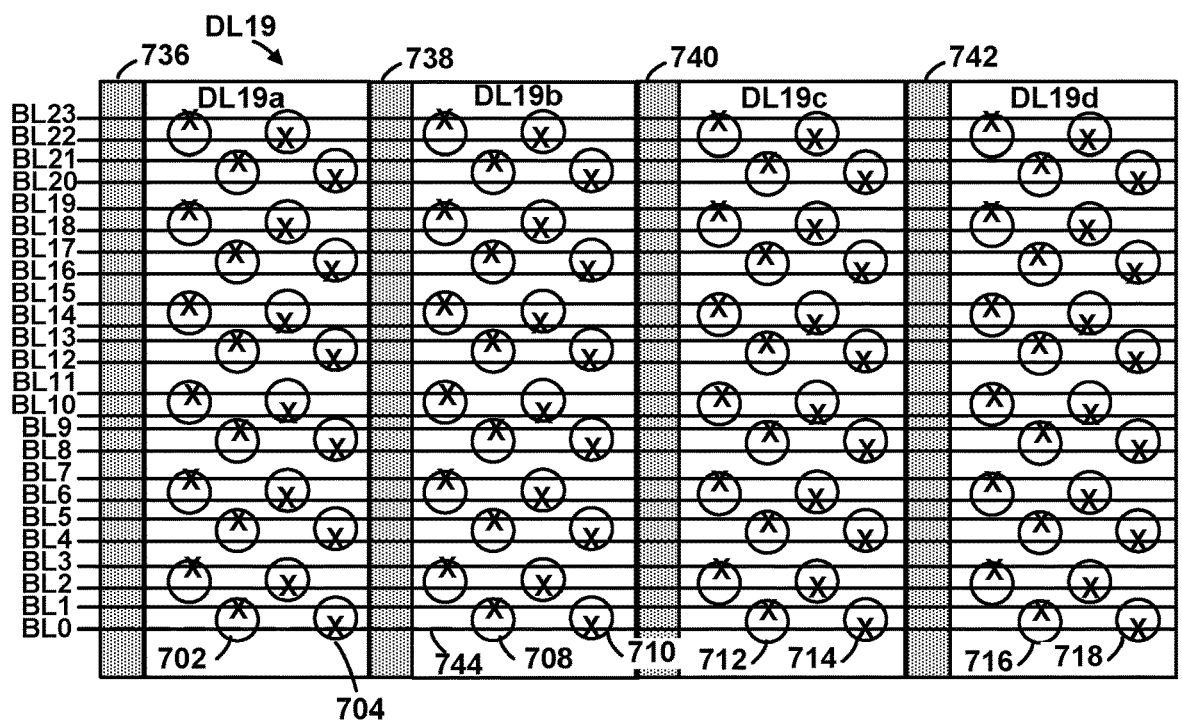
FIG. 7B depicts a top view of an example top dielectric layer DL19 of the stack of FIG. 6B.

Region WLL0*a* has example memory holes 702 and 704 along a line 706. Region WLL0*b* has example memory holes 708 and 710. Region WLL0*c* has example memory holes 712 and 714. Region WLL0*d* has example memory holes 716 and 718. The memory holes are also shown in FIG. 7B. Each memory hole can be part of a respective NAND string. For example, memory holes 702, 708, 712 and 716 can be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 722 are in WLL0*a*, memory cells 724 and 726 are in WLL0*b*, memory cells 728 and 730 are in WLL0*c*, and memory cells 732 and 734 are in WLL0*d*. These memory cells are at a common height in the stack.

Metal-filled slits 736, 738, 740 and 742 (e.g., metal interconnects) may be located between and adjacent to the edges of the regions WLL0*a*-WLL0*d*. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B depicts a top view of an example top dielectric layer DL19 of the stack of FIG. 6B. Dielectric layer DL19 is divided into regions DL19*a*, DL19*b*, DL19*c* and DL19*d*. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

Region DL19*a* has the example memory holes 702 and 704 along a line 744 which is coincident with a bit line BL0. A number of bit lines extend above the memory holes and are connected to the memory holes as indicated by the "X" symbols. BL0 is connected to a set of memory holes which includes memory holes 704, 710, 714 and 718. Another example bit line BL1 is connected to a set of memory holes which includes memory holes 702, 708, 712 and 716. Metal-filled slits 736, 738, 740 and 742 from FIG. 7A also are depicted, as they extend vertically through the stack. The bit lines can be numbered in a sequence BL0-BL23 across the DL19 layer in the x-direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 8A:
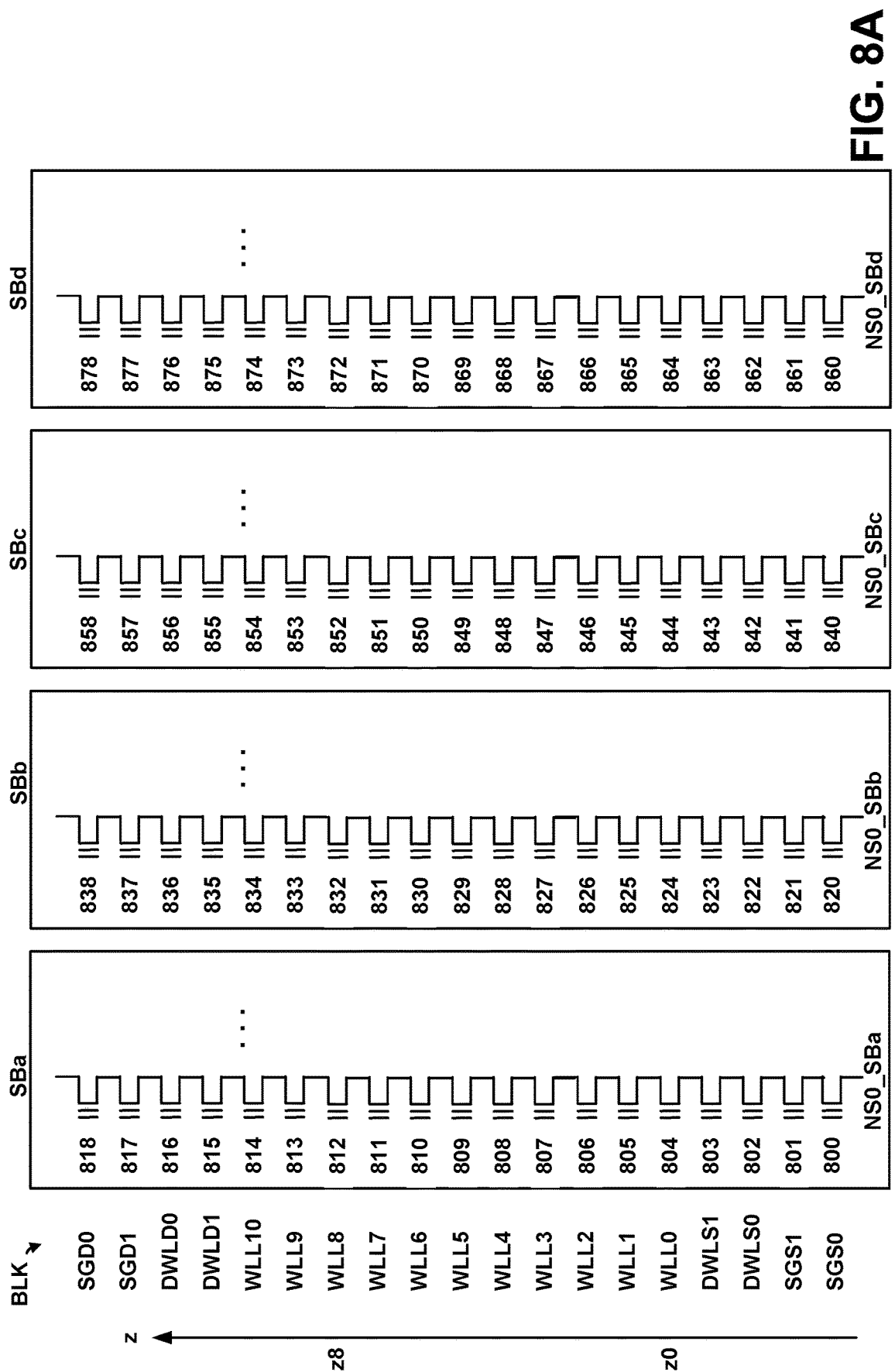
FIG. 8A depicts example NAND strings in the sub-blocks SBa-SBd of FIG. 7A.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa includes an example NAND string NS0_SBa, SBb includes an example NAND string NS0_SBb, SBc includes an example NAND string NS0_SBc, and SBd includes an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the another set of memory cells (e.g., including the memory cell 812) connected to another word line (e.g., WLL8) are at another height (z8) in the stack.

Figure 8B:
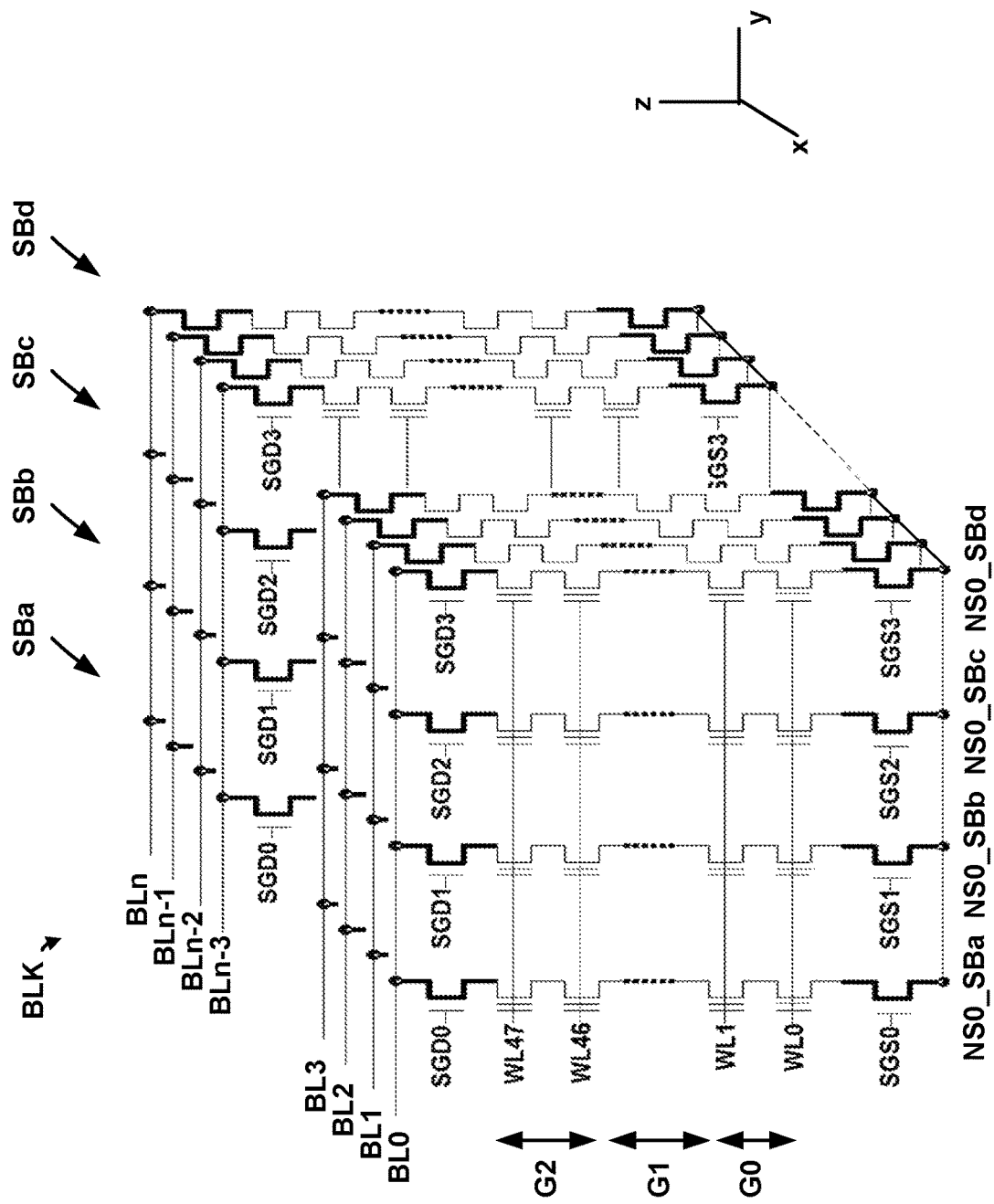
FIG. 8B depicts another example view of NAND strings in sub-blocks.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block includes a set of NAND strings which extend in the x direction and which have a common SGD line, e.g., SGD0, SGD1, SGD2 or SGD3. In this simplified example, there is only one SGD transistor and one SGS transistor in each NAND string. NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

A programming operation for a set of memory cells typically involves applying a series of program voltage (Vpgm) pulses to the memory cells after the memory cells are provided in an erased state. Each Vpgm pulse is provided in a program loop, also referred to as a program-verify iteration. For example, the Vpgm pulses may be applied to a word line which is connected to control gates of the memory cells. In one approach, incremental step pulse programming is performed, where the Vpgm pulse amplitude is increased by a step size in each program loop. Verify operations may be performed after each Vpgm pulse to determine whether the memory cells have completed programming. When programming is completed for a memory cell, the memory cell can be locked out from further programming while programming continues for other memory cells in subsequent program loops.

Each memory cell may be associated with a memory state according to write data in a program command. Based on its memory state, a memory cell will either remain in the erased state or be programmed to a memory state (a programmed memory state) different from the erased state. For example, in a two-bit per cell memory device, there are four memory states including the erased state and three programmed memory states referred to as the S1, S2 and S3 memory states. In a three-bit per cell memory device, there are eight memory states including the erased state and seven programmed memory states referred to as the S1, S2, S3, S4, S5, S6 and S7 memory states. In a four-bit per cell memory device, there are sixteen memory states including the erased state and fifteen programmed memory states referred to as the Er, S1, S2, S3, S4, S5, S6, S7, S8, S9, S10, S11, S12, S13, S14 and S15 memory states.

FIG. 9A depicts an embodiment of threshold voltage distributions for a four-state memory device in which each memory cell stores two bits of data. A first Vth distribution 900 is provided for erased (Er-state) storage elements. Three Vth distributions 902, 940 and 906 represent programmed memory states S1, S2 and S3C, respectively. A 2-bit code having lower and upper bits can be used to represent each of the four memory states. In an embodiment, the "Er," "S1," "S2," and "S3" memory states are respectively represented by "11," "01," "00," and "10."

FIG. 9B depicts an embodiment of threshold voltage distributions for an eight-state memory device in which each memory cell stores three bits of data. A first Vth distribution 910 is provided for Er-state storage elements. Seven Vth distributions 912, 914, 916, 918, 920, 922 and 924 represent programmed memory states S1, S2, S3, S4, S5, S6 and S7, respectively. A 3-bit code having lower, middle and upper bits can be used to represent each of the eight memory states. In an embodiment, the "Er," S1, S21, S3, S4, S5, S6 and S7 memory states are respectively represented by "111," "011," "001," "101," "100," "000," "010" and "110."

FIG. 9C depicts an embodiment of threshold voltage distributions for a sixteen-state memory device in which each memory cell stores four bits of data. A first Vth distribution 930 is provided for erased Er-state storage elements. Fifteen Vth distributions 932, 934, 936, 938, 940, 942, 944, 946, 948, 950, 952, 954, 956, 958 and 960 represent programmed memory states S1, S2, S3, S4, S5, S6, S7, S8, S9, S10, S11, S12, S13, S14 and S15, respectively.

Figure 10:
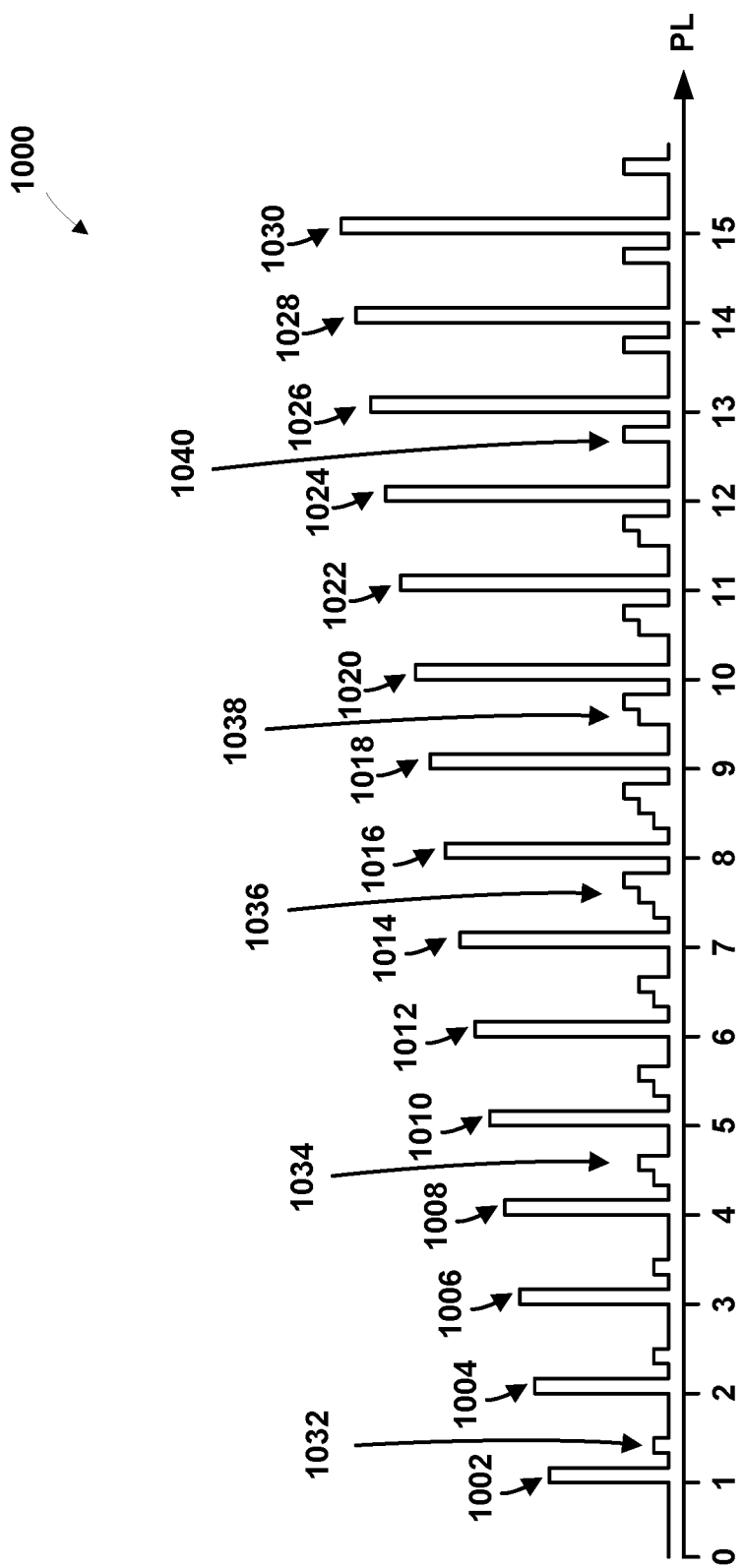
FIG. 10 depicts a waveform of an example memory cell programming operation.

FIG. 10 depicts a waveform 1000 of an example memory cell programming operation for a four-state memory device having an erased state (Er) and three programmed memory states (e.g., S1, S2, S3), such as depicted in FIG. 9A. The horizontal axis depicts a program loop number and the vertical axis depicts control gate or word line voltage. Generally, a programming operation can involve applying a pulse train to a selected word line, where the pulse train includes multiple program loops or program-verify iterations. The program portion of the program-verify iteration includes a Vpgm pulse, and the verify portion of the program-verify iteration includes one or more verify pulses.

For each Vpgm pulse, a square waveform is depicted for simplicity, although other shapes are possible such as a multilevel shape or a ramped shape. Further, Incremental Step Pulse Programming (ISPP) is used in this example, in which the Vpgm pulse amplitude steps up in each successive program loop. This example uses ISPP in a single programming pass in which the programming is completed. ISPP also can be used in each programming pass of a multi-pass operation.

A pulse train typically includes Vpgm pulses which increase stepwise in amplitude in each program-verify iteration using a fixed or varying step size. A new pulse train starts at an initial Vpgm pulse level and ends at a final Vpgm pulse level which does not exceed a maximum allowed level.

Pulse train 1000 includes a series of Vpgm pulses 1002, 1004, 1006, 1008, 1010, 1012, 1014, 1016, 1018, 1020, 1022, 1024, 1026, 1028 and 1030 that are applied to a word line selected for programming, and an associated set of non-volatile memory cells. One, two or three verify voltage pulses are provided after each Vpgm pulse as an example, based on the target memory states which are being verified. A voltage of 0V may be applied to the selected word line between the Vpgm pulses and verify voltage pulses.

In an embodiment, S1-state verify voltage Vv1 (e.g., waveform or signal 1032) may be applied after each of the first, second and third Vpgm pulses 1002, 1004 and 1006, respectively.

S1-state and S2-state verify voltages Vv1 and Vv2 (e.g., waveform or signal 1034) may be applied after each of the fourth, fifth and sixth Vpgm pulses 1008, 1010 and 1012, respectively.

S1-state, S2-state and S3-state verify voltages Vv1, Vv2 and Vv3 (e.g., waveform or signal 1036) may be applied after each of the seventh and eighth Vpgm pulses 1014 and 1016, respectively.

S2-state and S3-state verify voltages Vv2 and Vv3 (e.g., waveform or signal 1038) may be applied after each of the ninth, tenth and eleventh Vpgm pulses 1018, 1020 and 1022, respectively.

Finally, a S3-state verify voltage Vv3 (e.g., waveform or signal 1040) may be applied after each of the twelfth, thirteenth, fourteenth and fifteenth Vpgm pulses 1012, 1013, 1014 and 1015, respectively.

Figure 11A:
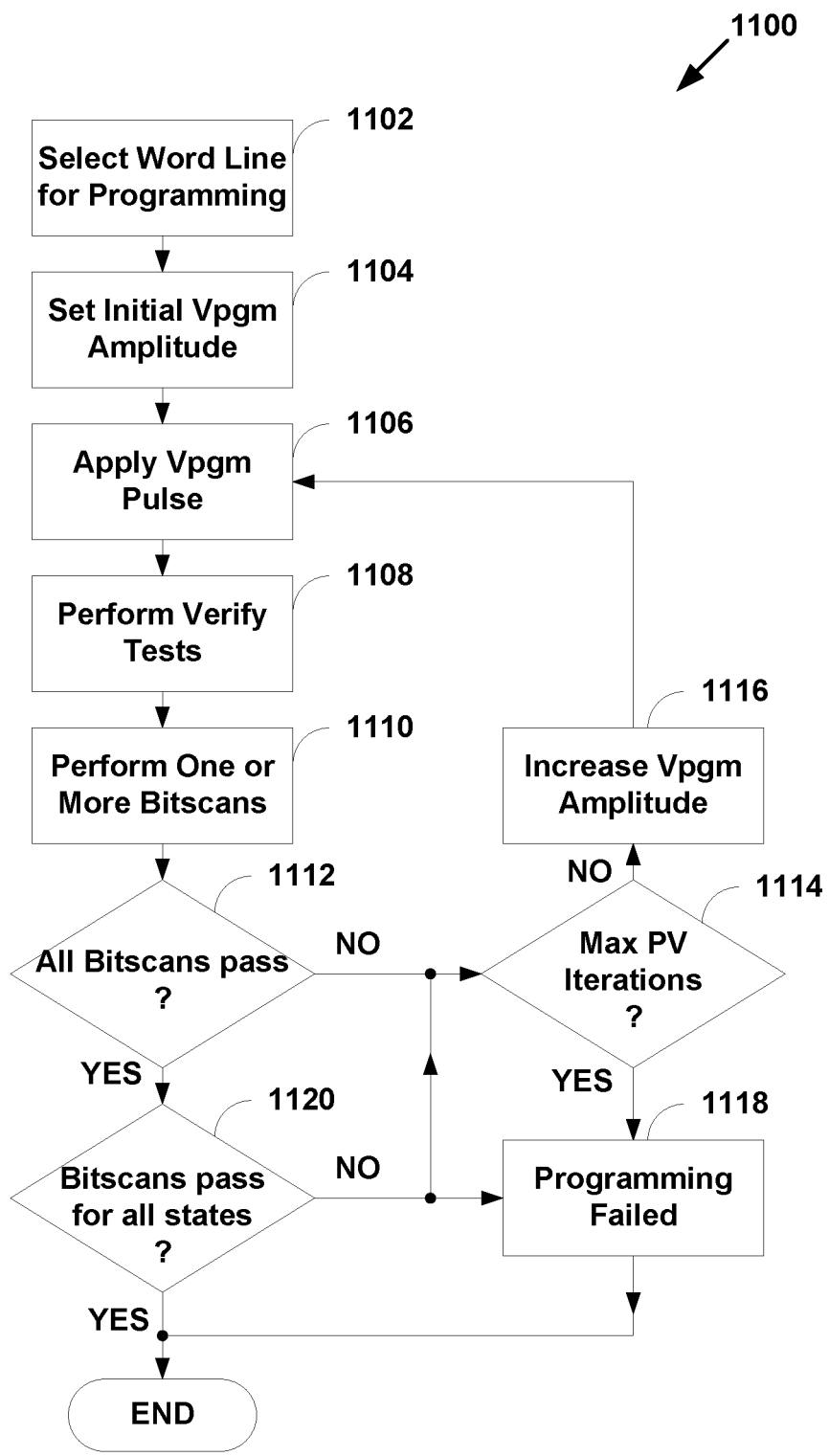
FIG. 11A is a flowchart of an example programming process in a memory device.

FIG. 11A is a flowchart of an example process 1100 for programming memory cells. In an embodiment, process 1000 may be performed in a memory device, such as memory device 100 of FIG. 1. At step 1102, a word line is selected for programming. In an embodiment, the selected word line is coupled to one or more memory cells. In an embodiment, each memory cell coupled to the selected word line is in an Er-state prior to programming. In an embodiment, during programming, each memory cell coupled to the selected word line will be left in the Er-state or programmed to one of multiple programmed memory states, such as the programmed memory states depicted in FIGS. 9A-9C.

In an embodiment, each memory cell coupled to the selected word line is associated with one or more data latches used to store a code that represents the desired memory state of the memory cell. For example, FIG. 9B depicts an example 3-bit code used to represent each of eight memory states. In an embodiment, prior to programming a memory cell, the associated data latches for the memory cell are loaded with the code representing the desired memory state of the memory cell.

At step 1104, an initial Vpgm pulse amplitude is set. In an embodiment, the initial Vpgm pulse amplitude may be between about 8V and about 30 V, although other values may be used.

At step 1106, a Vpgm pulse is applied to the selected word line. In the first iteration of step 1106, the applied Vpgm pulse has the pulse amplitude specified in step 1104. As described above, prior to programming, each memory cell coupled to the selected word line is in an Er-state. As a result of applying the Vpgm pulse to the selected word line, the threshold voltage of memory cells coupled to the selected word line are shifted higher. The amount of threshold voltage shift varies from memory cell to memory cell, resulting in a threshold voltage distribution across the population of memory cells coupled to the selected word line.

At step 1108, a verification signal (e.g., a waveform including one or more verify pulses) is applied to the selected word line while performing verify tests for one or more memory states. The verify tests determine if the threshold voltage of each memory cell has shifted above particular verify voltage levels. In an embodiment, if the threshold voltage of a memory cell has not shifted above the verify voltage level for that memory cell, the code value in the associated data latches for the memory cell are not modified. In an embodiment, if the threshold voltage of a memory cell has shifted above the verify voltage level for that memory cell, the code value in the associated data latches for the memory cell are changed to the code value associated with the Er-state (e.g., "111" in the example of FIG. 9B).

For example, referring again to FIG. 9B, if the threshold voltage of an S1-state memory cell has not shifted above verify voltage Vv1, the code value in the associated data latches for the memory cell is not modified and remains "011." If, however, the threshold voltage of an S1-state memory cell has shifted above verify voltage Vv1, the code value in the associated data latches for the memory cell is changed to "111."

In an embodiment, corresponding verify tests are performed for state K memory cells (memory cells assigned to represent state K). In another embodiment, corresponding verify tests are performed for state K memory cells, state (K+1) memory cells, and state (K+2) memory cells, where state K, state (K+1) and state (K+2) are three consecutive memory states. For example, at the start of programming K may be the S1 state of FIG. 9C, and corresponding verify tests are performed for state S1 cells, state S2 cells, and state S3 cells. Persons of ordinary skill in the art will understand that corresponding verify tests may be performed for more or fewer than three states.

In an embodiment, a lockout status is set for memory cells which pass the verify tests of step 1108. For example, referring again to FIG. 9B, a lockout status is set for state S1 memory cells that pass the corresponding state S1 verify tests at step 1108, a lockout status is set for state S2 memory cells that pass the corresponding state S2 verify tests at step 1108, and so on.

Referring again to FIG. 11A, at step 1110, one or more bitscans are performed. As described above and as used herein, a bitscan is a count of a number of memory cells whose threshold voltage has not shifted above a particular verify voltage level for a particular memory state. For example, a state S1 bitscan is a count of a number of state S1 memory cells whose threshold voltage has not shifted above a verify voltage level for state S1. Likewise, a state S2 bitscan is a count of a number of state S2 memory cells whose threshold voltage has not shifted above a verify voltage level for state S2, and so on.

As described above, for an S1-state memory cell whose threshold voltage has not shifted above verify voltage Vv1, the code value in the associated data latches for the memory cell is not modified and remains "011." Thus, in an embodiment, a state S1 bitscan may be performed by counting a number of data latches having code value "011." Likewise, a state S2 bitscan may be performed by counting a number of data latches having code value "001," and so on.

FIG. 11B depicts a high level block diagram of an embodiment of a bitscan circuit 1130a for use with a group of J, 3-bit memory cells having the example programmed memory states S1-S7 and code values depicted in FIG. 9B. Bitscan circuit 1130a is an example bitscan operation circuit 150 of FIG. 1A. As described in more detail below, bitscan circuit 1130a may be used to calculate a single state bitscan result for any of programmed memory states S1-S7.

Bitscan circuit 1130a includes a bitscan control circuit 1132a, state S1-S7 logic circuits 1134a-1134g, a J:1 MUX 1136 and a counter circuit 1138. Bitscan circuit 1130a is coupled to data latches for J memory cells 1140, which provide 3×J bits of data to state S1-S7 logic circuits 1134a-1134g. Bitscan control circuit 1132a provides a state enable signal ENs to selectively enable one of state S1-S7 logic circuits 1134a-1134g, provides a mux select signal Mse1 to J:1 MUX 1136 to selectively couple the J-bit output of one of state S1-S7 logic circuits 1134a-1134g to a J-bit input of counter circuit 1138, and provides a counter enable signal ENc to trigger counter circuit 1138 to perform a count of the number of bits having a value "1" in the J-bit input to counter circuit 1138.

FIG. 11C depicts a diagram of an embodiment of state S1-S7 logic circuits 1134a-1134g coupled to data latches DL1-DL3. FIG. 11C also includes a table showing the example data latch values for the erased state Er and each of programmed memory states S1-S7. Each of state S1-S7 logic circuits 1134a-1134g is coupled to J sets of data latches DL1-DL3, and includes J sets of 3-input NAND gates, each coupled to a corresponding one of the J sets of data latches DL1-DL3. An inverter is coupled between a data latch and a corresponding input of the 3-input NAND gate for each state code value equal to "0." Thus, for programmed memory state S1 (code value "011"), an inverter is coupled between data latch DL3 and the corresponding input to the 3-input NAND gate. Likewise, for programmed memory state S4 (code value "100"), an inverter is coupled between each of data latches DL1 and DL2 and the corresponding input to the 3-input NAND gate.

Each AND gate provides an output of "1" if the data latch values DL1-DL3 match the code value for the particular programmed memory state, and provides an output of "0" if all data latches DL1-DL3 have values other than the code value for the particular data state. Thus, state S1 logic circuit 1134a will provide a J-bit wide output bs1, with a "1" for each memory cell having associated data latch DL1-DL3 values "011," and a "0" for each memory cell having any other associated data latch DL1-DL3 values. Likewise, state S5 logic circuit 1134e will provide a J-bit wide output bs5, with a "1" for each memory cell having associated data latch DL1-DL3 values "000," and a "0" for each memory cell having any other associated data latch DL1-DL3 values.

Referring again to FIG. 11B, to perform a state S1 bitscan, bitscan control circuit 1132a selectively enables state S1 logic circuit 1134a, and provides mux select signal Mse1 to J:1 MUX 1136 to selectively couple the J-bit output bs1 of state S1 logic circuit 1134a to the J-bit input of counter circuit 1138. Control circuit 1132a provides counter enable signal ENc to trigger counter circuit 1138 to perform a count of the number of bits having a value "1" in J-bit output bs1 of state S1 logic circuit 1134a. The count is the state S1 bitscan.

Alternatively, to perform a S6 bitscan, bitscan control circuit 1132a selectively enables state S6 logic circuit 1134f, and provides mux select signal Mse1 to J:1 MUX 1136 to selectively couple the J-bit output bs6 of state S6 logic circuit 1134f to the J-bit input of counter circuit 1138. Control circuit 1132a provides counter enable signal ENc to trigger counter circuit 1138 to perform a count of the number of bits having a value "1" in J-bit output bs6 of state S6 logic circuit 1134f. The count is the state S6 bitscan.

As described above, bitscan circuit 1130a can be used to perform a single state bitscan for any of states S1-S7. To perform a multiple-state bitscan, bitscan control circuit 1132a can be configured to perform multiple single-state bitscans in sequence. For example, to perform bitscans for states S1, S2 and S3, control circuit 1132a can be configured to perform a state S1 bitscan, then perform a state S2 bitscan and then perform a state S3 bitscan.

Alternatively, multiple bitscan circuits 1130a may be used to perform a multi-state bitscan. For example, a first bitscan circuit 1130a may be used to perform a state S1 bitscan, a second bitscan circuit 1130a may be used to perform a state S2 bitscan, and a third bitscan circuit 1130a may be used to perform a state S3 bitscan, and so on.

FIG. 11D depicts a high level block diagram of an embodiment of another bitscan circuit 1130b for use with a group of J, 3-bit memory cells having the example programmed memory states S1-S7 and code values depicted in FIG. 9B. Bitscan circuit 1130b is an example bitscan operation circuit 150 of FIG. 1A. As described in more detail below, bitscan circuit 1130b may be used to calculate a multi-state bitscan result for programmed memory states S1-S7.

Bitscan circuit 1130b includes a bitscan control circuit 1132b, state S1-S7 logic circuits 1134a-1134g, a 7-input OR-gate 1142 and counter circuit 1138. Bitscan circuit 1130b is coupled to data latches for J memory cells 1140, which provide 3×J bits of data to state S1-S7 logic circuits 1134a-1134g. Bitscan control circuit 1132b provides a state enable signal ENs to selectively enable one or more of state S1-S7 logic circuits 1134a-1134g, and provides a counter enable signal ENc to trigger counter circuit 1138 to perform a count of the number of bits having a value "1" in the J-bit input to counter circuit 1138.

Bitscan circuit 1130b may be used to calculate a multi-state bitscan result for programmed memory states S1-S7. Bitscan control circuit 1132b selectively enables multiple ones of state S1-S7 logic circuits 1134a-1134g, the outputs of which are combined by OR-gate 1142 to provide a single J-bit output to counter 1138. Counter circuit 1138 performs a count of the number of bits having a value "1" in the J-bit input to counter circuit 1138, and the count is a composite bitscan for the multiple states selected by bitscan control circuit 1132b.

For example, to perform a bitscan for states S1-S3, bitscan control circuit 1132b selectively enables state S1 logic circuit 1134a, state S2 logic circuit 1134b, and state S3 logic circuit 1134c. The J-bit outputs bs1, bs2 and bs3 of state S1 logic circuit 1134a, state S2 logic circuit 1134b, and state S3 logic circuit 1134c, respectively, are combined by OR-gate 1142 to a single J-bit input of counter circuit 1138. Control circuit 1132b provides counter enable signal ENc to trigger counter circuit 1138 to perform a count of the number of bits having a value "1." The count is the bitscan for states S1-S3. Bitscan circuit 1130b thus can perform a multi-state bitscan in a single operation, counting bits as a batch from all selected states.

Referring again to FIG. 11A, in an embodiment, and as described in more detail below, step 1110 may perform bitscans in which the number of memory states for which bitscans are performed may be dynamically varied (referred to herein as a "dynamic variable state bitscan"). In particular, step 1110 may perform n-state bitscans or m-state bitscans, where m>n and n>0 (e.g., using bitscan circuit 1130a of FIG. 11B or bitscan circuit 1130b of FIG. 11D).

For example, if n=1 and m=2, step 1110 may dynamically perform 1-state bitscans (e.g., a state S1 bitscan, a state S2 bitscan, a state S3 bitscan, and so on) and 2-state bitscans (e.g., a state S1 bitscan and a state S2 bitscan, a state S2 bitscan and a state S3 bitscan, a state S3 bitscan and a state S4 bitscan, and so on). In another embodiment, and as described in more detail below, step 1110 may selectively perform (1) a single state bitscan, and (2) a dynamic variable state bitscan.

At step 1112, a determination is made whether each of the bitscans performed in step 1110 "pass." As used herein, a bitscan is said to "pass" if the bitscan count for a particular state is less than a predetermined value. Conversely, a bitscan is said to "fail" if the bitscan for a particular state is greater than or equal to the predetermined value. In an embodiment, the predetermined value is less than a number of read errors that can be corrected by an ECC engine, such as ECC engine 128 of FIG. 1A. Other values may be used for the predetermined value.

If at step 1112 all bitscans performed in step 1110 are determined not to have passed, at step 1114 a determination is made whether a maximum number of program-verify (PV) iterations has been performed. If at step 1114 the number of PV iterations has not exceeded a maximum, at step 1116 the Vpgm pulse amplitude is increased. In embodiment, the Vpgm pulse amplitude may be increased between about 0.1V to about 0.8V, although other values may be used. If at step 1114 the number of PV iterations has exceeded a maximum, at step 1118 programming is deemed to have failed, and process 1100 ends.

If at step 1112 all bitscans performed in step 1110 are determined to have passed, at step 1120 a determination is made whether bitscans have passed for all programming states. If at step 1120 all bitscans are determined to have not yet passed for all programming states, the process proceeds to step 1114, described above. If at step 1120 all bitscans are determined to have passed for all programming states, programming is complete and process 1100 ends.

FIG. 12A is a flowchart of an example process 1200a for programming memory cells using an embodiment of a dynamic variable state bitscan that repeatedly switches between performing an n-state bitscan after each of multiple programming pulses, and performing an m-state bitscan after each of multiple programming pulses, where m>n, and n>0. In an embodiment, process 1200a may be performed in a memory device, such as memory device 100 of FIG. 1. blop At step 1202a, a Vpgm pulse is applied to a selected word line (e.g., as described above regarding step 1106 of FIG. 11A), a verification signal is applied to the selected word line while performing verify tests for one or more memory states (e.g., as described above regarding step 1108 of FIG. 11A), and an n-state bit scan is performed, starting from a first failed state from the previous iteration of step 1202a. On the first iteration of step 1202a, no prior bitscans have been performed, so the n-state bitscan starts at the first state.

At step 1204, a determination is made whether all n bitscans performed in step 1202a pass. If it is determined at step 1204 that all n bitscans do not pass, process 1200a returns to step 1202a to apply another Vpgm pulse (at an increased amplitude relative to the previous Vpgm pulse) to the selected word line, perform verify tests for one or more memory states, and perform an n-state bit scan, starting from the first failed state from the previous iteration of step 1202a.

If it is determined at step 1204 that all n bitscans pass, at step 1206 a determination is made whether bitscans have passed for all programming states. If at step 1206 all bitscans are determined to have passed for all programming states, programming is complete and process 1200a ends.

If at step 1206 all bitscans are determined to have not yet passed for all programming states, at step 1208a another Vpgm pulse (at an increased amplitude relative to the previous Vpgm pulse) is applied to the selected word line, verify tests are performed for one or more memory states, and an m-state bit scan is performed, starting from the first failed state from the previous iteration of step 1208a. On the first iteration of step 1208a following step 1206, the m-state bitscan starts at the first state following the last passing state of step 1202a.

At step 1210, a determination is made whether all m bitscans performed in step 1208a pass. If it is determined at step 1210 that all m bitscans do not pass, process 1200a returns to step 1208a to apply another Vpgm pulse (at an increased amplitude relative to the previous Vpgm pulse) to the selected word line, perform verify tests for one or more memory states, and perform an m-state bit scan, starting from the first failed state from the previous iteration of step 1208a.

If it is determined at step 1210 that all m bitscans pass, at step 1212 a determination is made whether bitscans have passed for all programming states. If at step 1212 all bitscans are determined to have passed for all programming states, programming is complete and process 1200a ends.

If at step 1212 all bitscans are determined to have not yet passed for all programming states, at step 1202a another Vpgm pulse (at an increased amplitude relative to the previous Vpgm pulse) is applied to the selected word line, verify tests are performed for one or more memory states, and an n-state bit scan is performed, starting at the first failed state from the previous iteration of step 1202a. On the first iteration of step 1202a following step 1212, the n-state bitscan starts at the first state following the last passing state of step 1208a.

Thus, process 1200a repeatedly switches between performing an n-state bitscan after each of multiple programming pulses until first predetermined criteria are satisfied, and performing an m-state bitscan after each of multiple programming pulses until second predetermined criteria are satisfied. In an embodiment, first predetermined criteria are that all n-state bitscans pass, and second predetermined criteria are that all m-state bitscans pass.

In example process 1200a, at each iteration of step 1202a, the n-state bit scan is performed starting from a first failed state from the previous iteration of step 1202a, and at each iteration of step 1208a, the m-state bit scan is performed starting from a first failed state from the previous iteration of step 1208a. In this regard, the bitscan operations count bits separately, state-by-state, and the process can determine which specific state bitscans pass and fail.

Figure 13A:
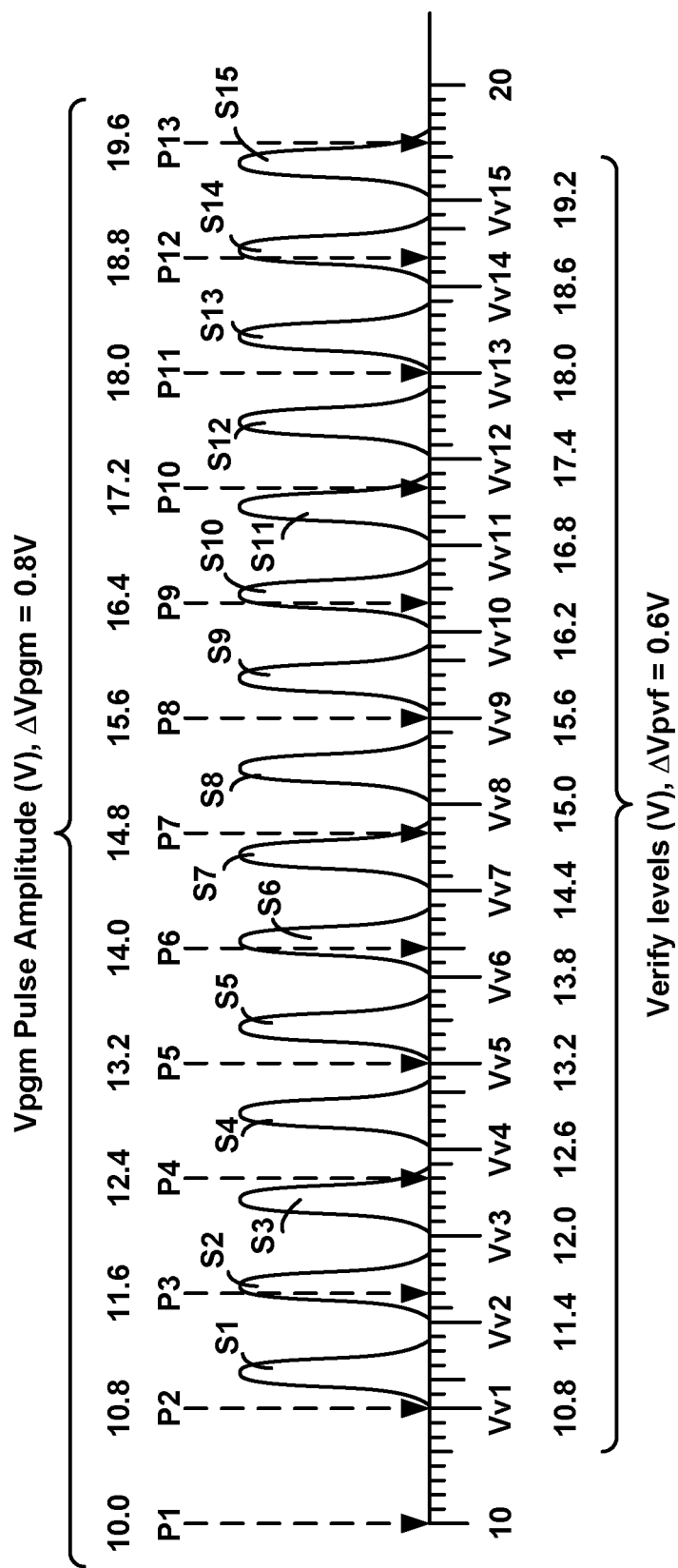
FIG. 13A depicts example program pulses, threshold voltage distributions and verify voltages for the example operation results depicted in FIGS. 12B and 12D.

FIG. 12B depicts results of an example operation of process 1200a of FIG. 12A, with n=1 and m=2, and using example Vpgm pulses, threshold voltage distributions and verify voltages depicted in FIG. 13A. In particular, FIG. 13A depicts Vpgm pulses P1, P2, P3, P4, P5, P6, P7, P8, P9, P10, P11, P12 and P13 having values (in volts) 10.0, 10.8, 11.6, 12.4, 13.2, 14.0, 14.8, 15.6, 16.4, 17.2, 18.0, 18.8 and 19.6, respectively, with a difference between consecutive Vpgm pulses (Δpgm) of 0.8V. FIG. 13A also depicts example threshold voltage distributions for a sixteen-state memory device in which each memory cell stores four bits of data (an ER-state distribution is not shown). Fifteen Vth distributions represent programmed memory states S1, S2, S3, S4, S5, S6, S7, S8, S9, S10, S11, S12, S13, S14 and S15. Verify voltages Vv1, Vv2, Vv3, Vv4, Vv5, Vv6, Vv7, Vv8, Vv9, Vv10, Vv11, Vv12, Vv13, Vv14 and Vv15 have values (in volts) 10.8, 11.4, 12.0, 12.6, 13.2, 13.8, 14.4, 15.0, 15.6, 16.2, 16.8, 17.4, 18.0, 18.6 and 19.2, respectively, with a spacing between consecutive verify levels (ΔVpvf) of 0.6V. Other Vpgm pulse amplitudes, Δpgm values, verify voltage values, and Δpvf values may be used.

In the example depicted in FIG. 12B, two verify tests are performed following each Vpgm pulse, and each verify test is represented by a ▲ symbol. For example, following the Vpgm pulse P1 (10.0V), verify tests are performed for state S1 memory cells and state S2 memory cells, following the Vpgm pulse P5 (13.2V), verify tests are performed for state S4 memory cells and state S5 memory cells, and so on. In other embodiments, more than two verify tests may be performed following each Vpgm pulse.

Following the verify tests, bitscans are performed according to the steps of process 1200a of FIG. 12A. In particular, the process repeatedly switches between performing a 1-state bitscan after each of multiple programming pulses until the 1-state bitscan passes, and performing a 2-state bitscan after each of multiple programming pulses until both 2-state bitscans pass.

Thus, beginning at step 1202a, a Vpgm pulse P1 (10.0V) is applied to a selected word line, verify tests are performed, and then an n=1-state bitscan is performed starting at the first failed state from the previous iteration of step 1202a. As described above, on the first iteration of step 1202a, no prior bitscans have been performed, so the 1-state bitscan starts at the first state, S1. The state S1 bitscan fails (10.0V is less than Vv1=10.8V). Thus, at step 1204 all 1-state bitscans are determined not to have passed, and the process returns to step 1202a. A next Vpgm pulse P2 (10.8V) is applied to the selected word line, verify tests are performed, and then a 1-state bitscan is performed starting at the first failed state from the previous iteration of step 1202a (state S1). The state S1 bitscan passes (10.8V is equal to Vv1=10.8V). Thus, at step 1204 all 1-state bitscans are determined to have passed, and the process proceeds to step 1206.

At step 1206, because bitscans for all 15 states have not yet passed, the process then proceeds to step 1208a, a next Vpgm pulse P3 (11.6V) is applied to the selected word line, verify tests are performed, and then an m=2-state bitscans are performed starting at the first failed state from the previous iteration of step 1208a. As described above, on the first iteration of step 1208a following step 1206, the 2-state bitscan starts at the first state following the last passing state of step 1202a (state S1). Thus, step 1208a performs a state S2 bitscan and a state S3 bitscan.

The state S2 bitscan passes (11.6V is greater than Vv2=11.4V), but the state S3 bitscan fails (11.6V is less than Vv3=12.0V). Thus, at step 1210 all 2-state bitscans are determined not to have passed, and the process returns to step 1208a. A next Vpgm pulse P4 (12.4V) is applied to the selected word line, verify tests are performed, and then 2-state bitscan is performed starting at first failed state from the previous iteration of step 1208a (S3). Thus, step 1208a performs a state S3 bitscan and a state S4 bitscan. The state S3 bitscan passes (12.4V is greater than Vv3=12.0V), but the state S4 bitscan fails (12.4V is less than Vv4=12.6V).

Thus, at step 1210 all 2-state bitscans are determined not to have passed, and the process returns to step 1208a. A next Vpgm pulse P5 (13.2V) is applied to the selected word line, verify tests are performed, and then 2-state bitscan is performed starting at first failed state from the previous iteration of step 1208a (S4). Thus, step 1208a performs a state S4 bitscan and a state S5 bitscan. The state S4 bitscan passes (13.2V is greater than Vv4=12.6V), and the state S5 bitscan passes (13.2V is equal to Vv5=13.2V). Thus, at step 1210 all 2-state bitscans are determined to have passed, and the process proceeds to step 1212.

At step 1212, because bitscans for all 15 states have not yet passed, the process then proceeds to step 1202a, a next Vpgm pulse P6 (14.0V) is applied to the selected word line, verify tests are performed, and then an n=1-state bitscan is performed starting at the first failed state from the previous iteration of step 1202a. As described above, on the first iteration of step 1202a following step 1212, the 1-state bitscan starts at the first state following the last passing state of step 1208a (state S5). Thus, step 1202a performs a state S6 bitscan. The state S6 bitscan passes (14.0V is greater than Vv6=13.8V). Thus, at step 1204 all 1-state bitscans are determined to have passed, and the process proceeds to step 1206.

Process 1200a continues as described above, repeatedly switching between performing a 1-state bitscan after each of multiple programming pulses until first predetermined criteria are satisfied (e.g., all 1-state bitscans pass), and performing a 2-state bitscan after each of multiple programming pulses until second predetermined criteria are satisfied (e.g., all 2-state bitscans pass).

FIG. 12C is a flowchart of an example process 1200b for programming memory cells using an embodiment of a dynamic variable state bitscan that repeatedly switches between performing an n-state bitscan after each of multiple programming pulses, and performing an m-state bitscan after each of multiple programming pulses, where m>n, and n>0. In an embodiment, process 1200b may be performed in a memory device, such as memory device 100 of FIG. 1.

At step 1202b, a Vpgm pulse is applied to a selected word line (e.g., as described above regarding step 1106 of FIG. 11A), a verification signal is applied to the selected word line while performing verify tests for one or more memory states (e.g., as described above regarding step 1108 of FIG. 11A), and an n-state bit scan is performed, starting from the current state in the previous iteration of step 1202b. On the first iteration of step 1202b, no prior bitscans have been performed, so the n-state bitscan starts at the first state.

At step 1204, a determination is made whether all n bitscans performed in step 1202a pass. If it is determined at step 1204 that all n bitscans do not pass, process 1200b returns to step 1202b to apply another Vpgm pulse (at an increased amplitude relative to the previous Vpgm pulse) to the selected word line, perform verify tests for one or more memory states, and perform an n-state bit scan, starting from the current state from the previous iteration of step 1202b.

If it is determined at step 1204 that all n bitscans pass, at step 1206 a determination is made whether bitscans have passed for all programming states. If at step 1206 all bitscans are determined to have passed for all programming states, programming is complete and process 1200b ends.

If at step 1206 all bitscans are determined to have not yet passed for all programming states, at step 1208b another Vpgm pulse (at an increased amplitude relative to the previous Vpgm pulse) is applied to the selected word line, verify tests are performed for one or more memory states, and an m-state bit scan is performed, starting from the current state from the previous iteration of step 1208b. On the first iteration of step 1208b following step 1206, the m-state bitscan starts at the first state following the last passing state of step 1202b.

At step 1210, a determination is made whether all m bitscans performed in step 1208b pass. If it is determined at step 1210 that all m bitscans do not pass, process 1200a returns to step 1208b to apply another Vpgm pulse (at an increased amplitude relative to the previous Vpgm pulse) to the selected word line, perform verify tests for one or more memory states, and perform an m-state bit scan, starting from the current state from the previous iteration of step 1208b.

If it is determined at step 1210 that all m bitscans pass, at step 1212 a determination is made whether bitscans have passed for all programming states. If at step 1212 all bitscans are determined to have passed for all programming states, programming is complete and process 1200b ends.

If at step 1212 all bitscans are determined to have not yet passed for all programming states, at step 1202b another Vpgm pulse (at an increased amplitude relative to the previous Vpgm pulse) is applied to the selected word line, verify tests are performed for one or more memory states, and an n-state bit scan is performed, starting at the current state from the previous iteration of step 1202b. On the first iteration of step 1202b following step 1212, the n-state bitscan starts at the first state following the last passing state of step 1208b.

Thus, process 1200b repeatedly switches between performing an n-state bitscan after each of multiple programming pulses until first predetermined criteria are satisfied, and performing an m-state bitscan after each of multiple programming pulses until second predetermined criteria are satisfied. In an embodiment, first predetermined criteria are that all n-state bitscans pass, and second predetermined criteria are that all m-state bitscans pass.

In example process 1200b, at each iteration of step 1202b, the n-state bit scan is performed starting from a current state from the previous iteration of step 1202b, and at each iteration of step 1208b, the m-state bit scan is performed starting from a current state from the previous iteration of step 1208b. In this regard, the bitscan operations count bits as a batch from all states, and the process cannot determine which specific state bitscans pass and fail. But this process may be more time-efficient in terms of bitscan counting because separate bitscan counts are not required for each of the n-state and m-state bitscans.

FIG. 12D depicts results of an example operation of process 1200b of FIG. 12C, with n=1 and m=2, and using example Vpgm pulses, threshold voltage distributions and verify voltages depicted in FIG. 13A. In the example depicted in FIG. 12D, two verify tests are performed following each Vpgm pulse, and each verify test is represent by a ▲ symbol. In other embodiments, more than two verify tests may be performed following each Vpgm pulse.

Following the verify tests, bitscans are performed according to the steps of process 1200b of FIG. 12C. In particular, the process repeatedly switches between performing a 1-state bitscan after each of multiple programming pulses until the 1-state bitscan passes, and performing a 2-state bitscan after each of multiple programming pulses until both 2-state bitscans pass.

Thus, beginning at step 1202b a Vpgm pulse P1 (10.0V) is applied to a selected word line, verify tests are performed, and then an n=1-state bitscan is performed starting at the current state from the previous iteration of step 1202b. As described above, on the first iteration of step 1202b, no prior bitscans have been performed, so the 1-state bitscan starts at the first state, S1. The state S1 bitscan fails (10.0V is less than Vv1=10.8V). Thus, at step 1204 all 1-state bitscans are determined not to have passed, and the process returns to step 1202b. A next Vpgm pulse P2 (10.8V) is applied to the selected word line, verify tests are performed, and then a 1-state bitscan is performed starting at the first failed state from the previous iteration of step 1202a (state S1). The state S1 bitscan passes (10.8V is equal to Vv1=10.8V). Thus, at step 1204 all 1-state bitscans are determined to have passed, and the process proceeds to step 1206.

At step 1206, because bitscans for all 15 states have not yet passed, the process then proceeds to step 1208*b*, a next Vpgm pulse P3 (11.6V) is applied to the selected word line, verify tests are performed, and then an m=2-state bitscans are performed starting at the current state from the previous iteration of step 1208*b*. As described above, on the first iteration of step 1208*b* following step 1206, the 2-state bitscan starts at the first state following the last passing state of step 1202*b* (state S1). Thus, step 1208*b* performs a state S2 bitscan and a state S3 bitscan.

The state S2 bitscan passes (11.6V is greater than Vv2=11.4V), but the state S3 bitscan fails (11.6V is less than Vv3=12.0V). Thus, at step 1210 all 2-state bitscans are determined not to have passed, and the process returns to step 1208*b*. A next Vpgm pulse P4 (12.4V) is applied to the selected word line, verify tests are performed, and then 2-state bitscan is performed starting at the current state from the previous iteration of step 1208*b* (S2). Thus, step 1208*b* performs another state S2 bitscan and another state S3 bitscan. The state S2 bitscan again passes (12.4V is greater than Vv2=11.4V), and the state S3 bitscan passes (12.4V is greater than Vv3=12.0V). Because the state S2 bitscan passed on the first iteration of step 1208*b*, the verify and state S2 bitscan on the second iteration of step 1208*b* is referred to herein as an "extra verify." Thus, at step 1210 all 2-state bitscans are determined to have passed, and the process proceeds to step 1212.

At step 1212, because bitscans for all 15 states have not yet passed, the process then proceeds to step 1202*b*, a next Vpgm pulse P5 (13.2V) is applied to the selected word line, verify tests are performed, and then an n=1-state bitscan is performed starting at the current state from the previous iteration of step 1202*b*. As described above, on the first iteration of step 1202*b* following step 1212, the 1-state bitscan starts at the first state following the last passing state of step 1208*b* (state S3). Thus, step 1202*b* performs a state S4 bitscan. The state S4 bitscan passes (13.2V is greater than Vv4=12.6V). Thus, at step 1204 all 1-state bitscans are determined to have passed, and the process proceeds to step 1206. Note that state S5 also passes verify at Vpgm pulse P5 (13.2V is equal to Vv5=13.2V).

Process 1200*b* continues as described above, repeatedly switching between performing a 1-state bitscan after each of multiple programming pulses until first predetermined criteria are satisfied (e.g., all 1-state bitscans pass), and performing a 2-state bitscan after each of multiple programming pulses until second predetermined criteria are satisfied (e.g., all 2-state bitscans pass).

FIG. 12E is a flowchart of an example process 1220 for programming memory cells using an embodiment that selectively performs (1) a single state bitscan, and (2) a dynamic variable state bitscan. In an embodiment, process 1220 may be performed in a memory device, such as memory device 100 of FIG. 1.

At step 1222, an average threshold voltage change per applied Vpgm pulse ($\Delta Vt$) is determined. For example, Vpgm pulses may be applied to a population of memory cells, and an average threshold voltage change per applied Vpgm pulse may be determined.

At step 1224, a determination is made whether $\Delta Vt$, the determined average threshold voltage change per applied Vpgm pulse, is less than or equal to $\Delta Vpvf$, the spacing between consecutive verify levels.

If at step 1224 the determination is made that $\Delta Vt \leq \Delta Vpvf$, the process proceeds to step 1226, and a single state bitscan process is performed after each of multiple programming pulses. An example single state bitscan process is described below and depicted in FIG. 12F. If at step 1224 the determination is made that $\Delta Vt$ is not $\leq \Delta Vpvf$, the process proceeds to step 1228, and a dynamic variable state bitscan is performed after each of multiple programming pulses. In an embodiment, step 1228 may perform dynamic variable state bitscans that repeatedly switch between performing an n-state bitscan after each of multiple programming pulses, and performing an m-state bitscan after each of multiple programming pulses, where m>n, and n>0, such as described above in the example processes of FIGS. 12A and 12C.

Figure 12F:
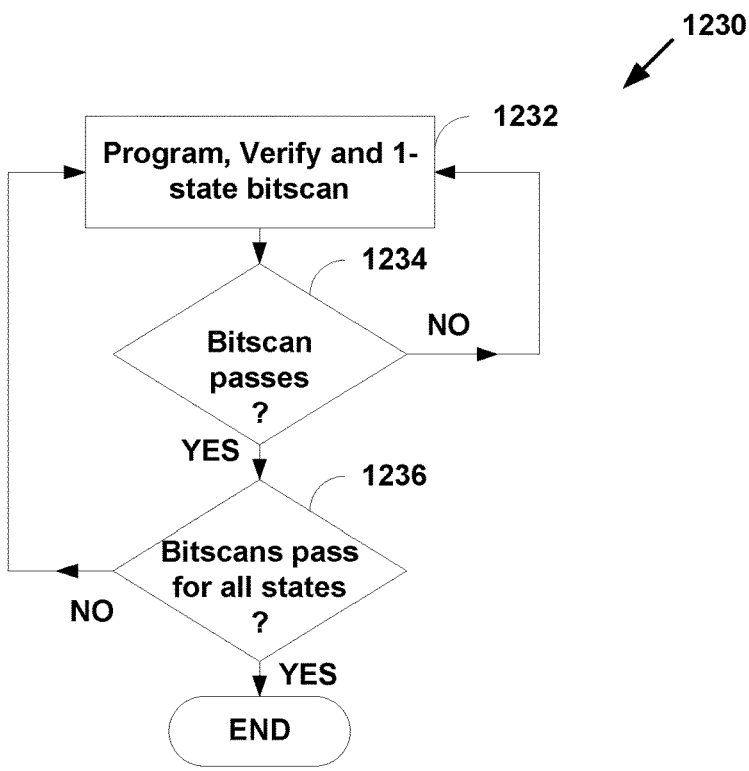
FIG. 12F is a flowchart of another example programming process in a memory device.

FIG. 12F is a flowchart of an example process 1230 for programming memory cells using an embodiment of a single state bitscan. In an embodiment, process 1230 may be performed in a memory device, such as memory device 100 of FIG. 1.

At step 1232, a Vpgm pulse is applied to a selected word line (e.g., as described above regarding step 1106 of FIG. 11A), a verification signal is applied to the selected word line while performing verify tests for one or more memory states (e.g., as described above regarding step 1108 of FIG. 11A), and a single state bit scan is performed. On the first iteration of step 1232, the single state bitscan starts at the first state.

At step 1234, a determination is made whether the bitscan performed in step 1232 pass. If it is determined at step 1234 that the bitscan does not pass, process 1230 returns to step 1232 to apply another Vpgm pulse (at an increased amplitude relative to the previous Vpgm pulse) to the selected word line, perform verify tests for one or more memory states, and perform a single state bit scan, starting from same first failed state from the previous iteration of step 1232.

If it is determined at step 1234 that the bitscan passes, at step 1236 a determination is made whether bitscans have passed for all programming states. If at step 1236 all bitscans are determined to have passed for all programming states, programming is complete and process 1230 ends.

If at step 1236 all bitscans are determined to have not yet passed for all programming states, process 1230 return to step 1232, and another Vpgm pulse (at an increased amplitude relative to the previous Vpgm pulse) is applied to the selected word line, verify tests are performed for one or more memory states, and single state bit scan is performed, starting at the next state after the passing state of the previous iteration of step 1232. Process 1230 continue until single state bitscans have passed for all programming states.

Figure 12G:
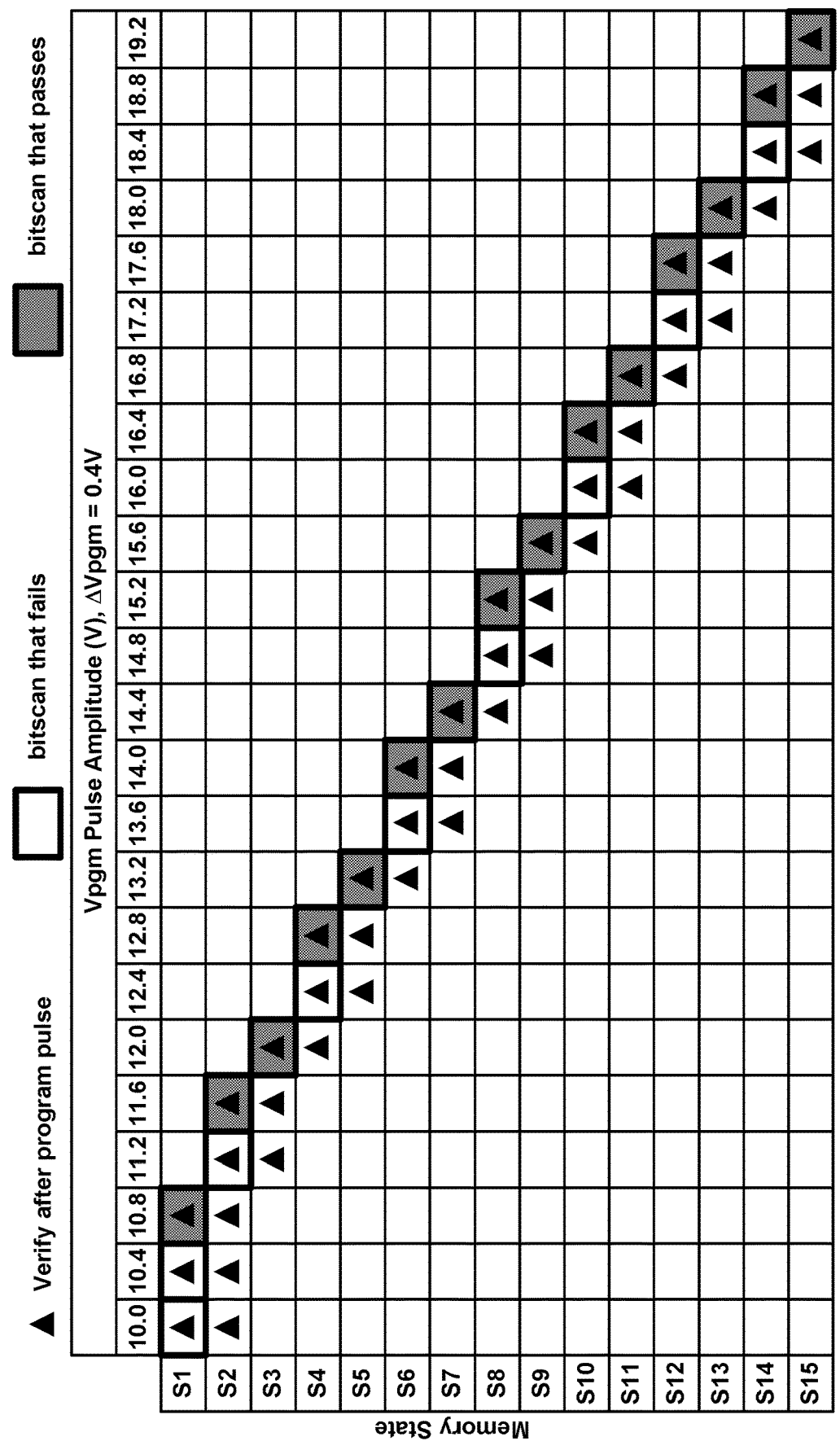
FIG. 12G depicts results of an example operation of the process of FIG. 12E.
Figure 13B:
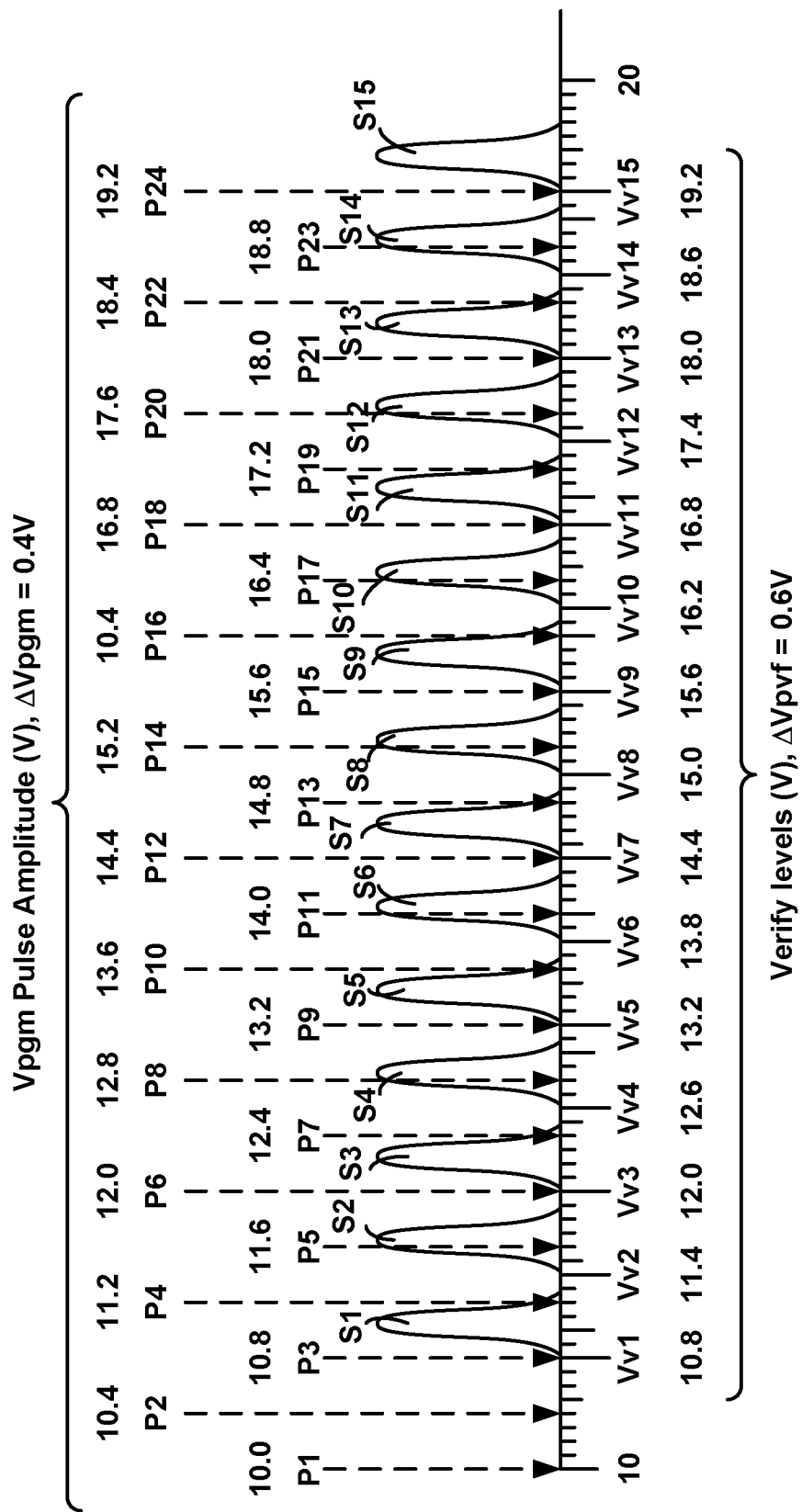
FIG. 13B depicts example program pulses, threshold voltage distributions and verify voltages for the example operation results depicted in FIG. 12G.

FIG. 12G depicts results of an example operation of process 1230 of FIG. 12F, using example Vpgm pulses, threshold voltage distributions and verify voltages depicted in FIG. 13B. In particular, FIG. 13B depicts Vpgm pulses P1, P2, P3, P4, P5, P6, P7, P8, P9, P10, P11, P12, P13, P14, P15, P16, P17, P18, P19, P20, P21, P22, P23 and P24 having values (in volts) 10.0, 10.4, 10.8, 11.2, 11.6, 12.0, 12.4, 12.8, 13.2, 13.6, 14.0, 14.4, 14.8, 15.2, 15.6, 16.0, 16.4, 16.8, 17.2, 17.6, 18.0, 18.4, 18.8 and 19.2, respectively, with a difference between consecutive Vpgm pulses ($\Delta$pgm) of 0.4V. FIG. 13B also depicts example threshold voltage distributions for a sixteen-state memory device in which each memory cell stores four bits of data (an ER-state distribution is not shown). Fifteen Vth distributions represent programmed memory states S1, S2, S3, S4, S5, S6, S7, S8, S9, S10, S11, S12, S13, S14 and S15. Verify voltages Vv1, Vv2, Vv3, Vv4, Vv5, Vv6, Vv7, Vv8, Vv9, Vv10, Vv11, Vv12, Vv13, Vv14 and Vv15 have values (in volts) 10.8, 11.4, 12.0, 12.6, 13.2, 13.8, 14.4, 15.0, 15.6, 16.2, 16.8, 17.4, 18.0, 18.6 and 19.2, respectively, with a spacing between consecutive verify levels ($\Delta$Vpvf) of 0.6V. Other Vpgm pulse amplitudes, $\Delta$pgm values, verify voltage values, and $\Delta$pvf values may be used.

In the example depicted in FIG. 12G, two verify tests are performed following each Vpgm pulse, and each verify test is represent by a ▲ symbol. In other embodiments, more than two verify tests may be performed following each Vpgm pulse.

Following the verify tests, a single state bitscan is performed according to the steps of process 1230 of FIG. 12F. As described above, a single state bitscan is a bitscan operation performed for one state. Thus, beginning at step 1232, a Vpgm pulse P1 (10.0V) is applied to a selected word line, verify tests are performed, and then a single state bitscan is performed starting at state S1. The state S1 bitscan fails (10.0V is less than Vv1=10.8V). Thus, at step 1234 the single state bitscan is determined not to have passed, and the process returns to step 1232. A next Vpgm pulse P2 (10.4V) is applied to the selected word line, verify tests are performed, and then a single state bitscan is performed starting at the failed state from the previous iteration of step 1232 (state S1). The state S1 bitscan again fails (10.4V is less than Vv1=10.8V). Thus, at step 1234 the single state bitscan is determined not to have passed, and the process returns to step 1232. A next Vpgm pulse P3 (10.8V) is applied to the selected word line, verify tests are performed, and then a single state bitscan is performed starting at the failed state from the previous iteration of step 1232 (state S1). At step 1234, the single state bitscan is determined to pass (10.8V is equal to Vv1=10.8V). Thus, the process proceeds to step 1236.

At step 1236, because bitscans for all 15 states have not yet passed, the process then returns to step 1232, a next Vpgm pulse P4 (11.2V) is applied to the selected word line, verify tests are performed, and then a single state bitscan is performed starting at the first state following the last passing state of step 1232 (state S1). Thus, step 1232 performs a state S2 bitscan. The state S2 bitscan fails (11.2V is less than Vv2=11.4V). Thus, at step 1234 the single state bitscan is determined not to have passed, and the process returns to step 1232. The process steps of process 1230 continue until bitscans pass for all fifteen states.

Accordingly, it can be seen that, in one embodiment, an apparatus is provided that includes a plurality of memory cells, a programming circuit configured to apply a plurality of programming pulses to the memory cells, and a scanning circuit configured to repeatedly switch between performing an n-state bitscan after each programming pulse until first predetermined criteria are satisfied, and performing an m-state bitscan after each programming pulse until second predetermined criteria are satisfied, where m>n, and n>0.

In another embodiment, an apparatus is provided that includes a plurality of memory cells, a programming circuit configured to apply a plurality of programming pulses to the memory cells, a first bitscan circuit configured to perform a single state bitscan after each of multiple programming pulses, and a second bitscan circuit configured to perform a dynamic variable state bitscan by counting bits state-by-state after each of multiple programming pulses.

In another embodiment, a method is provided that includes applying programming pulses to a plurality of memory cells each including a plurality of memory states, determining an average threshold voltage change per applied programming pulse, selectively performing a single state bitscan or a dynamic variable state bitscan after each of multiple programming pulses based on the determined average threshold voltage change per applied programming pulse.

In another embodiment, an apparatus is provided that includes a plurality of memory cells, a programming means configured to apply a plurality of programming pulses to the memory cells, and a means for performing bitscans on the plurality of memory cells. The means for performing bitscans includes means for performing an n-state bitscan after each programming pulse, means for determining that all n states pass the n-state bitscan, means for performing an m-state bitscan after each programming pulse, where m>n, means for determining that all m states pass the m-state bitscan, and means for performing an n-state bitscan after each programming pulse.

The programming means may include read/write circuits 108, row decoder 110, and power control module 126 of FIG. 1A, or other logic hardware, and/or other executable code stored on a computer readable storage medium or device. Other embodiments may include similar or equivalent means.

The means for performing bitscans may include control circuits 106 and controller 114 of FIG. 1A, or other logic hardware, and/or other executable code stored on a computer readable storage medium or device. Other embodiments may include similar or equivalent means.

The means for performing an n-state bitscan after each programming pulse may include control circuits 106 and controller 114 of FIG. 1A, or other logic hardware, and/or other executable code stored on a computer readable storage medium or device. Other embodiments may include similar or equivalent means.

The means for determining that all n states pass the n-state bitscan may include control circuits 106 and controller 114 of FIG. 1A, or other logic hardware, and/or other executable code stored on a computer readable storage medium or device. Other embodiments may include similar or equivalent means.

The means for performing an m-state bitscan after each programming pulse may include control circuits 106 and controller 114 of FIG. 1A, or other logic hardware, and/or other executable code stored on a computer readable storage medium or device. Other embodiments may include similar or equivalent means.

The means for determining that all m states pass the m-state bitscan may include control circuits 106 and controller 114 of FIG. 1A, or other logic hardware, and/or other executable code stored on a computer readable storage medium or device. Other embodiments may include similar or equivalent means.

In another embodiment, a system is provided that includes a memory die including a plurality of memory cells, and a controller connected to the memory die, the controller configured to apply a plurality of programming pulses to the memory cells, and perform a variable state bitscan after each of multiple programming pulses, wherein the variable state bitscan repeatedly switches between an n-state bitscan and an m-state bitscan, where m>n. and n>0.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application, to thereby enable others skilled in the art to best utilize the technology in various embodiments and with various modifications as are suited to the particular use contemplated. The scope of the technology is defined by the claims appended hereto.

The invention claimed is:

1. An apparatus comprising:
a plurality of memory cells;
a programming circuit configured to apply a plurality of programming pulses to the memory cells; and
a scanning circuit configured to repeatedly switch between:
performing an n-state bitscan after each of multiple programming pulses until first predetermined criteria are satisfied; and
performing an m-state bitscan after each of multiple programming pulses until second predetermined criteria are satisfied, where m>n, and n>0.

2. The apparatus of claim 1, wherein the first predetermined criteria comprises passing the n-state bitscan, and the second predetermined criteria comprises passing the m-state bitscan.

3. The apparatus of claim 2, wherein:
passing the n-state bitscan comprises determining that a number of memory cells that have not been programmed to a desired memory state is less than a predetermined value for each of n memory states; and
passing the m-state bitscan comprises determining that the number of memory cells that have not been programmed to a desired memory state is less than the predetermined value for each of m memory states.

4. The apparatus of claim 1, wherein:
performing an n-state bitscan comprises determining a number of memory cells that have not been programmed to a desired memory state for each of n memory states; and
performing an m-state bitscan comprises determining a number of memory cells that have not been programmed to a desired memory state for each of m memory states.

5. The apparatus of claim 1, further comprising:
a first counting circuit configured to count a number of memory cells that have not been programmed to a desired memory state for each of n memory states; and
a second counting circuit configured to count a number of memory cells that have not been programmed to a desired memory state for each of m memory states.

6. The apparatus of claim 5, wherein the first counting circuit and second counting circuit are each configured to collectively count memory cells for all memory states.

7. The apparatus of claim 5, wherein the first counting circuit and second counting circuit are each configured to separately count memory cells for each memory state.

* * * * *